(12) United States Patent
Nomura et al.

(10) Patent No.: US 7,710,476 B2
(45) Date of Patent: May 4, 2010

(54) COLOR FILTER ARRAY, IMAGING DEVICE, AND IMAGE PROCESSING UNIT

(75) Inventors: Yoshikuni Nomura, Tokyo (JP); Tomoo Mitsunaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 473 days.

(21) Appl. No.: 11/714,261

(22) Filed: Mar. 6, 2007

(65) Prior Publication Data

US 2007/0216785 A1   Sep. 20, 2007

(30) Foreign Application Priority Data

Mar. 14, 2006   (JP) .............................. 2006-069541

(51) Int. Cl.
- H04N 3/14   (2006.01)
- H04N 5/335  (2006.01)
- H04N 9/04   (2006.01)
- H04N 9/083  (2006.01)

(52) U.S. Cl. ....................................... 348/273; 348/294

(58) Field of Classification Search ......... 348/270–273, 348/278–280, 294
See application file for complete search history.

(56) References Cited

U.S. PATENT DOCUMENTS

| 3,971,065 A | 7/1976 | Bayer |
| 4,716,455 A | 12/1987 | Ozawa et al. |
| 5,552,827 A | 9/1996 | Maenaka et al. |
| 5,889,554 A * | 3/1999 | Mutze .......................... 348/273 |
| 6,803,955 B1 * | 10/2004 | Yosida ......................... 348/272 |
| 7,123,299 B1 * | 10/2006 | Yoshida et al. ............... 348/277 |
| 2004/0174446 A1 * | 9/2004 | Acharya ...................... 348/279 |
| 2006/0198556 A1 * | 9/2006 | Chen et al. ................... 382/162 |
| 2007/0296841 A1 * | 12/2007 | Nomura ....................... 348/273 |

FOREIGN PATENT DOCUMENTS

| EP | 0 804 037 A2 | 10/1997 |
| JP | 2931520 | 5/1999 |
| JP | 2000-316169 | 11/2000 |
| JP | 2005-160044 | 6/2005 |

* cited by examiner

*Primary Examiner*—Gevell Selby
(74) *Attorney, Agent, or Firm*—Finnegan, Henderson, Farabow, Garrett & Dunner, L.L.P.

(57) ABSTRACT

A color filter array includes a plurality of filters, each having one of a plurality of types of spectral sensitivity and being disposed at the location of a corresponding one of a plurality of pixels. The filters of a predetermined type selected from among the plurality of types are arranged at the locations of the pixels in a checkered pattern, and the filters of some or all of the other types are randomly arranged at the pixel locations at which the filters of the predetermined type are not present.

13 Claims, 15 Drawing Sheets

| C4 | C1 | C3 | C1 | C5 | C1 | C5 |
|----|----|----|----|----|----|----|
| C1 | C2 | C1 | C4 | C1 | C2 | C1 |
| C5 | C1 | C5 | C1 | C3 | C1 | C4 |
| C1 | C2 | C1 | C2 | C1 | C3 | C1 |
| C4 | C1 | C5 | C1 | C4 | C1 | C5 |
| C1 | C4 | C1 | C3 | C1 | C5 | C1 |
| C3 | C1 | C2 | C1 | C3 | C1 | C2 |

FIG. 1

| R | G | R | G | R | G | R |
|---|---|---|---|---|---|---|
| G | B | G | B | G | B | G |
| R | G | R | G | R | G | R |
| G | B | G | B | G | B | G |
| R | G | R | G | R | G | R |
| G | B | G | B | G | B | G |
| R | G | R | G | R | G | R |

FIG. 3

| C4 | C1 | C3 | C1 | C5 | C1 | C5 |
|----|----|----|----|----|----|----|
| C1 | C2 | C1 | C4 | C1 | C2 | C1 |
| C5 | C1 | C5 | C1 | C3 | C1 | C4 |
| C1 | C2 | C1 | C2 | C1 | C3 | C1 |
| C4 | C1 | C5 | C1 | C4 | C1 | C5 |
| C1 | C4 | C1 | C3 | C1 | C5 | C1 |
| C3 | C1 | C2 | C1 | C3 | C1 | C2 |

FIG. 4

| R | G | R  | G  | R | G  | R |
|---|---|----|----|---|----|---|
| G | B | G  | B' | G | B  | G |
| R | G | R  | G  | R | G  | R |
| G | B'| G  | B  | G | B  | G |
| R | G | R  | G  | R | G  | R |
| G | B'| G  | B  | G | B' | G |
| R | G | R  | G  | R | G  | R |

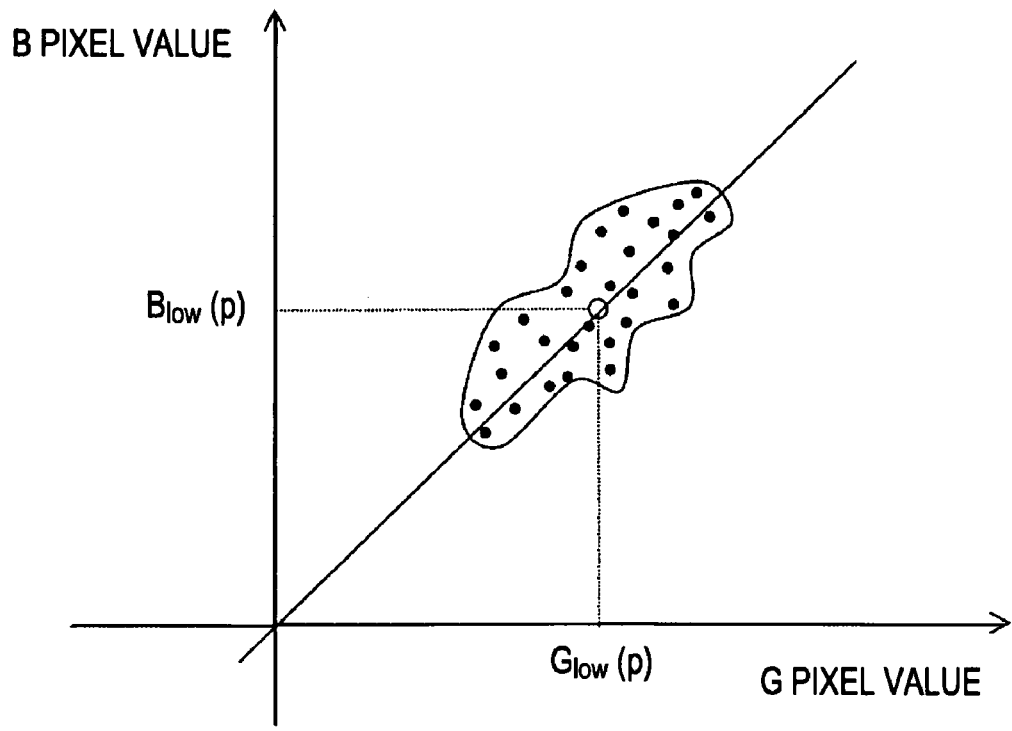

FIG. 15

| R' | G  | R  | G  | R  | G  | R' |
|----|----|----|----|----|----|----|
| G' | B  | G' | B' | G' | B  | G' |
| R  | G  | R' | G  | R' | G  | R  |
| G' | B' | G' | B  | G' | B  | G' |
| R' | G  | R  | G  | R  | G  | R' |
| G' | B' | G' | B  | G' | B' | G' |
| R  | G  | R' | G  | R  | G  | R' |

FIG. 17

| R | G | R | G | R | G | R |
|---|---|---|---|---|---|---|
| G' | B | G' | B' | G' | B | G' |
| R | G | R | G | R | G | R |
| G' | B' | G' | B | G' | B | G' |
| R | G | R | G | R | G | R |
| G' | B' | G' | B | G' | B' | G' |
| R | G | R | G | R | G | R |

COLOR FILTER ARRAY, IMAGING DEVICE, AND IMAGE PROCESSING UNIT

CROSS REFERENCES TO RELATED APPLICATIONS

The present invention contains subject matter related to Japanese Patent Application JP 2006-069541 filed in the Japanese Patent Office on Mar. 14, 2006, the entire contents of which are incorporated herein by reference.

BACKGROUND OF THE INVENTION

1. Field of the Invention

The present invention relates to a color filter array, an imaging device, and an image processing unit used for an image capturing apparatus, such as a digital camera using a solid-state imaging device.

2. Description of the Related Art

Single-plate color image capturing apparatuses that include an image processing unit are known. In the image capturing apparatuses, a color filter is bonded to each of a plurality of pixels of a single-plate solid-state imaging device and the image processing unit allocates all colors to the position of each pixel using a mosaic image of colors captured by the imaging device.

In such image capturing apparatuses using a single-plate solid-state imaging device, only a single spectral sensitivity is obtained. Accordingly, in general, to obtain a color image, different color filters are bonded to a plurality of pixels so as to be arranged in a specific pattern. In the captured image, each pixel provides only one color. Therefore, in terms of colors, a mosaic image is generated. However, by interpolating the color of a pixel using color information that can be obtained from the adjacent pixels, an image in which each pixel has a full color can be generated. Such an interpolating process is referred to as a "color separation process" or a "demosaic process".

For most of the single-plate color image capturing apparatuses, as a color filter arrangement, a Bayer array format described in Bryce E. Bayer, U.S. Pat. No. 3,971,065 entitled "COLOR IMAGING ARRAY" is used. As shown in FIG. 1, in this arrangement, G color filters are arranged in a checkered pattern so that the density of the G color filters is twice that of R color filters or B color filters. Accordingly, in most methods of interpolating a color of a pixel, a G color having a large amount of information and a strong relation to the brightness of light is interpolated to all the pixels first, and subsequently, R and B colors are interpolated using the G color as a reference.

For example, in the method described in Ozawa, Akiyama, Satoh, Nagahara and Miura, U.S. Pat. No. 4,716,455 entitled "Chrominance Signal Interpolation Device for a Color Camera," on ground that a ratio of a low-frequency component of each color in a local region is substantially constant, G color is allocated to all of the pixels. Thereafter, an average of a ratio of R color to G color and an average of a ratio of B color to G color of the adjacent pixels are multiplied by the G color of a pixel of interest. Thus, unknown color components are estimated.

In addition, in this interpolation method, on ground that the G color filters are arranged in a checkered pattern, the resolutions in a horizontal direction and a vertical direction can be increased.

For example, Japanese Patent No. 2931520 entitled "Color Separation Circuit of Single-plate Color Video Camera" describes a technique in which a correlation value at the position of an interpolated pixel in a horizontal direction or in a vertical direction is computed. Two interpolation values obtained by processing means appropriate when the correlation in the horizontal direction is strong and processing means appropriate when the correlation in the vertical direction is strong are mixed using the correlation value.

According to the above-described techniques, in a single-plate color image capturing apparatus, the R, G, and B colors can be allocated to positions of all the pixels for high-resolution display.

However, since each color is discretely sampled, aliasing (overlap of a high-frequency component with lower frequency components) occurs when a captured image contains a high-frequency component having a frequency higher than the Nyquist frequency, and therefore, a color different from an original color is estimated.

This color is referred to as a "false color". The false color is noticeable when a color filter arrangement in which color filters are regularly arranged is used, since a significant overlap occurs in a specific spatial frequency range. Once a false color is generated, it cannot be determined whether a color is an original color having an original low frequency or the false color caused by the overlap of a high-frequency component. Therefore, the false color cannot be removed by using a frequency filter.

Accordingly, to reduce the occurrence of a false color, known single-plate color image capturing apparatuses need to include an optical low-pass filter disposed in front of the imaging device so as to remove a high-frequency component in advance. However, the optical low-pass filter does not have a sharp cut-off capability for the Nyquist frequency. Therefore, if the single-plate color image capturing apparatuses attempt to completely prevent the occurrence of the false color, low-frequency components having a frequency lower than the Nyquist frequency could also be cut off.

In addition, in the Bayer arrangement, the Nyquist frequency of the R signal or the B signal is lower than that of the G signal. Accordingly, an optical low-pass filter suitable for the Nyquist frequency of the R channel or the B channel decreases the resolution of the G channel.

In practical applications, since a decrease in resolution is not allowed, complete removal of the false color is difficult. Furthermore, the installation of an optical low-pass filter prevents miniaturization and cost reduction of the image capturing apparatus.

Additionally, in contrast to the Bayer arrangement of three RGB color filters, the fidelity and the dynamic range of colors can be increased by using a filter arrangement of four colors or more.

For accurate color reproduction, a method using a large number of filters each transmitting light only in a narrow wavelength range, as shown in FIG. 2A, is more suitable than a method using a small number of filters each transmitting light in a wide wavelength range, as shown in FIG. 2C.

For an increase in the dynamic range, a method using a plurality of filters that have different transmittances but transmit light in the same wavelength range, as shown in FIG. 2B, is more suitable than a method using the filters shown in FIG. 2C.

However, the Bayer arrangement is still widely used. This is because as the number of pixels for one color is decreased, the resolution of that color channel deteriorates, and therefore, a false color easily occurs.

To solve this problem, technology has been invented in which the regularity of the color filter arrangement is reduced in order to reduce the occurrence of a false color.

More precisely, this technology solves the following problem. That is, a false color is visually noticeable and removal of the false color is difficult if most of the false colors occur in a specific spatial frequency range.

Similarly, as used herein, the reduction in the occurrence of a false color refers to the reduction in the occurrence of a false color concentrated in a specific spatial frequency range.

In a pseudo-random Bayer arrangement introduced by FillFactory, Belgium, (this document is available at http://www-.fillfactory.com/htm/technology/htm/rgbfaq.htm), G color filters are arranged in a checkered pattern. In addition, at positions other than those of the G color filters, R and B color filters are pseudo-randomly arranged. This arrangement is referred to as a "three-color G-checkered pseudo-random arrangement".

Additionally, Japanese Unexamined Patent Application Publication No. 2000-316169 describes a six-color random arrangement in which four sides or four corners of a pixel of interest are adjacent to filters of six colors.

Furthermore, Mutze, Ulrich, Dr., EP Patent Publication No. 0,804,037 entitled "Process and system for generating a full color image or multispectral image from the image data of a CCD image sensor with a mosaic color filter" describes an arrangement including a five-color 3-by-3 repetition pattern and a pseudo-random pattern.

All of the above-described arrangements include a random pattern. In addition, the two arrangements described in Japanese Unexamined Patent Application Publication No. 2000-316169 and EP Patent Publication No. 0,804,037, (A2) employ filters of more than three colors.

Because of the random pattern in the arrangements, the false color is dispersed in a variety of spatial frequency ranges, and therefore, the false color is not noticeable. In addition, the increase in the number of filters improves the dynamic range and the performance of the color reproduction.

However, although the pseudo-random Bayer arrangement introduced by FillFactory has a pseudo-random pattern, only the positions at which a false color occurs in the spatial frequency range are slightly different from those in the Bayer arrangement. This is because the frequency of the repetition is low. Therefore, in practice, the pseudo-random Bayer arrangement reduces the occurrence of a false color little. In addition, since the pseudo-random Bayer arrangement is a three-color filter arrangement, the performance of color reproduction and the dynamic range are substantially the same as those of the Bayer arrangement.

Since the two arrangements described in Japanese Unexamined Patent Application Publication No. 2000-316169 and EP Patent Publication No. 0,804,037, (A2) employ a stronger random pattern than the Bayer arrangement or the pseudo-random Bayer arrangement, the occurrence of a false color is reduced compared with the pseudo-random Bayer arrangement or the pseudo-random Bayer arrangement. However, since, in the two arrangements, all the color filters are randomly arranged, the resolution is decreased compared with that of the Bayer arrangement or the pseudo-random Bayer arrangement.

In general, in color separation processes, one color signal is interpolated with a high resolution first. Thereafter, the other color signals are interpolated using that color signal as a reference. Accordingly, compared with the Bayer arrangement or the pseudo-random Bayer arrangement in which G color filters are arranged in a checkered pattern and a correlation process described in Japanese Patent No. 2931520 is used, it is very difficult for the arrangements described in Japanese Unexamined Patent Application Publication No. 2000-316169 and EP Patent Publication No. 0,804,037, (A2) to generate a reference color. Consequently, the reproducible frequency range is significantly different for the position of each pixel.

Furthermore, since the arrangements described in Japanese Unexamined Patent Application Publication No. 2000-316169 and EP Patent Publication No. 0,804,037, (A2) increase the number of colors compared with the Bayer arrangement, the number of pixels for one color is reduced. This results in a further decrease in resolution.

Still furthermore, in general, to read a signal out of a solid-state imaging device at high speed, the signals from the pixels are thinned out (dumped) or summed. The dumping and summing processes are cyclically executed. Accordingly, if a random filter arrangement is used, a filter pattern after dumping may be changed from the original pattern or signals from different pixels may be summed.

As noted above, while a random pattern in the filter arrangement and the increase in the number of colors reduce the occurrence of a false color and increase the dynamic range and the performance of color reproduction, the random pattern and the increase in the number of colors decrease the resolution and cause an unsuccessful operation of dumping and summing the signals from the pixels.

SUMMARY OF THE INVENTION

As noted above, while the technology in which color filters used for a single-plate color imaging device are randomly arranged in order to reduce the occurrence of a false color and the technology in which the number of colors used for filters are increased in order to improve the performance of color reproduction and the dynamic range have been invented, the resolution is decreased compared with existing filter arrangements, such as the Bayer arrangement. In addition, a successful operation cannot be performed in the dumping readout method and the summing readout method.

Accordingly, the present invention provides a color filter array, an imaging device, and an image processing unit capable of sufficiently preventing a decrease in resolution and the occurrence of a false color and supporting dumping and summing processes of signals from pixels even when filters of colors more than that of the Bayer arrangement are used.

According to an embodiment of the present invention, a color filter array includes a plurality of filters, each having one of a plurality of types of spectral sensitivity and being disposed at the location of a corresponding one of a plurality of pixels. The filters of a predetermined type selected from among the plurality of types are arranged at the locations of the pixels in a checkered pattern, and the filters of some or all of the other types are randomly arranged at the pixel locations at which the filters of the predetermined type are not present.

According to another embodiment of the present invention, a color filter array includes a plurality of filters, each having one of at least five types of spectral sensitivity and being disposed at the location of a corresponding one of a plurality of pixels. The filters of a first color $C1a$ selected from among the at least five types of color are arranged at the locations of the pixels on every other line in a horizontal direction and a vertical direction, the filters of a second color $C1b$ selected from among the at least five types of color are arranged at the pixel locations at which the filters of the first color $C1a$ are not present on every other line in a horizontal direction and a vertical direction, and the filters of some or all of the other colors are randomly arranged at the pixel locations at which neither the filters of the first color $C1a$ nor the second color $C1b$ are present.

According to still another embodiment of the present invention, an imaging device includes a color filter array including a plurality of filters, each having one of a plurality of types of spectral sensitivity and being disposed at the location of a corresponding one of a plurality of pixels. The filters of a predetermined type selected from among the plurality of types are arranged at the locations of the pixels in a checkered pattern, and the filters of some or all of the other types are randomly arranged at the pixel locations at which the filters of the predetermined type are not present.

According to yet still another embodiment of the present invention, an imaging device includes a color filter array including a plurality of filters, each having one of at least five types of spectral sensitivity and being disposed at the location of a corresponding one of a plurality of pixels. The filters of a first color $C1a$ selected from among the at least five types of color are arranged at the locations of the pixels on every other line in a horizontal direction and a vertical direction, the filters of a second color $C1b$ selected from among the at least five types of color are arranged at the pixel locations at which the filters of the first color $C1a$ are not present on every other line in a horizontal direction and a vertical direction, and the filters of some or all of the other colors are randomly arranged at the pixel locations at which neither the filters of the first color $C1a$ nor the second color $C1b$ are present.

According to yet still another embodiment of the present invention, an image processing unit includes receiving means for receiving image data from an imaging device including a color filter array, first interpolating means, and second interpolating means. The color filter array includes a plurality of filters, each having one of a plurality of types of spectral sensitivity and being disposed at the location of a corresponding one of a plurality of pixels. The filters of a predetermined type selected from among the plurality of types are arranged at the locations of the pixels in a checkered pattern, and the filters of some or all of the other types are randomly arranged at the pixel locations at which the filters of the predetermined type are not present. The first interpolating means interpolates a pixel value of a first color $C1$ at a pixel location of the image data received by the receiving means at which the predetermined color is not present using the colors $C1$ present in the vicinity of the pixel location so as to generate a first image. The second interpolating means interpolates a pixel value of a second color $CX$ different from the first color $C1$ using the first colors $C1$ and the second colors $CX$ that are present in a local region including a pixel of interest so as to generate a second image.

According to yet still another embodiment of the present invention, an image processing unit includes receiving means for receiving image data from an imaging device including a color filter array, first interpolating means, and second interpolating means. The color filter array includes a plurality of filters, each having one of at least five types of spectral sensitivity and being disposed at the location of a corresponding one of a plurality of pixels. The filters of a first color $C1a$ selected from among the at least five types of color are arranged at the locations of the pixels on every other line in a horizontal direction and a vertical direction, the filters of a second color $C1b$ selected from among the at least five types of color are arranged at the pixel locations at which the filters of the first color $C1a$ are not present on every other line in a horizontal direction and a vertical direction, and the filters of some or all of the other colors are randomly arranged at the pixel locations at which neither the filters of the first color $C1a$ nor the second color $C1b$ are present. The first interpolating means interpolate a pixel value of a third color $C1c$ at a pixel location of a pixel of interest using the pixel values of the first color $C1a$ and the second color $C1b$ that are present in a local region including the pixel of interest in the image data received by the receiving means. The second interpolating means interpolates a pixel value of each color $CX$ of the plurality of filter colors including the color $C1a$ and the color $C1b$ by using the pixel values of the third color $C1c$ and the color $CX$ that are present in the local region including the pixel of interest.

According to the present invention, a color filter array, an imaging device, and an image processing unit capable of sufficiently preventing a decrease in resolution and the occurrence of a false color and supporting dumping and summing processes of signals from a plurality of pixels even when filters of colors more than that of the Bayer arrangement are used.

BRIEF DESCRIPTION OF THE DRAWINGS

FIG. 1 is a diagram illustrating the structure of known color filter array;

FIG. 3 is a diagram illustrating the structure of a color filter array according to a first exemplary embodiment of the present invention;

FIG. 4 is a diagram illustrating a modification of a color filter array according to the first exemplary embodiment of the present invention;

FIG. 6 is a diagram in which pixels that are present in a local space are plotted in a G-B plane;

FIG. 7 is a diagram illustrating the structure of a color filter array having a five-color G checkered random arrangement according to the first exemplary embodiment of the present invention;

FIG. 15 illustrates an exemplary structure of a color filter array according to a second exemplary embodiment of the present invention;

FIG. 17 illustrates a modification of the color filter array according to the second exemplary embodiment of the present invention.

DESCRIPTION OF THE PREFERRED EMBODIMENTS

Figure 2C:
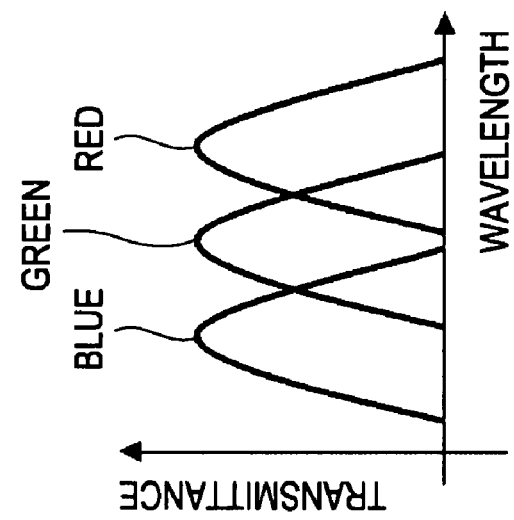
FIGS. 2A-2C illustrate the characteristics of examples of a color filter array.
Figure 2B:
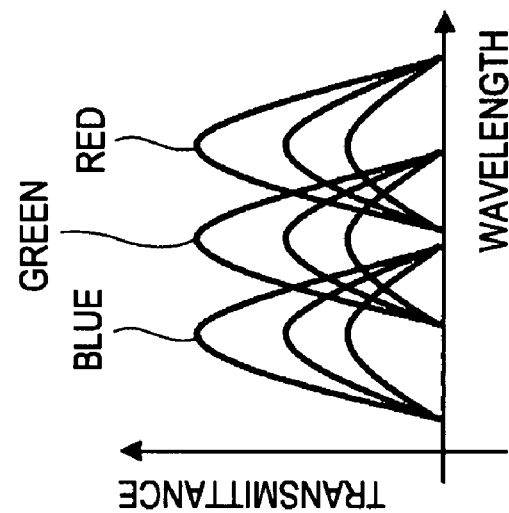
Figure 2A:
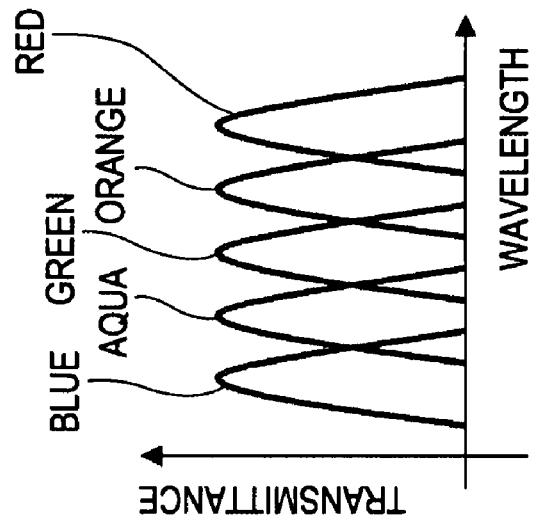

A color filter array, an imaging device, and an image processing unit according to exemplary embodiments of the present invention are now herein described.

First Exemplary Embodiment

According to a first exemplary embodiment, a filter arrangement is used for an imaging device in which one of a plurality of filters having different color separation characteristics (i.e., colors) is bonded to each pixel. The filter arrangement includes four colors or more. A color C1 is arranged in a checkered pattern. Some or all of the other colors are randomly arranged at pixel locations at which the color C1 is not present.

As used herein, the term "color" refers to a filter or a pixel value of that color obtained from the filter.

In such a color arrangement, since color filters of four colors or more are employed, the performance of color reproduction and the dynamic range can be improved compared with a three-color filter arrangement.

Since the color C1 has a checkered pattern, a correlation process that is applied to a G-color checkered pattern of the Bayer arrangement can be applied to the C1 checkered pattern. Accordingly, a signal in a high-frequency range can be reproduced.

In addition, by using a random pattern, the problem of a false color that tends to occur for a color CX other than the color C1 having a small number of pixels can be reduced.

Furthermore, by estimating (interpolating) a high-frequency component of the color CX using the color C1 as a reference, the color CX that is finally obtained at every position of the pixel can be reproduced as a signal containing the high-frequency component.

An exemplary color filter arrangement according to the present exemplary embodiment is shown in FIG. 3. This color filter arrangement is a five-color arrangement in which the color filters C1 are arranged in a checkered pattern and color filters C2, C3, C4, and C5 are randomly arranged at positions at which the color filters C1 are not present.

In addition, for any pixel of interest, the occurrence frequency of a color in an area including the pixel of interest and having a predetermined size is within a desired error range.

To estimate an unknown color at the position of a pixel of interest, the color needs to be present in the vicinity of the pixel of interest.

Accordingly, the occurrence frequency of a color in a local region needs to be within a desired range so as to avoid a filter arrangement in which only a specific color dominates.

An arrangement that satisfies the above-described conditions may be obtained through a plurality of attempts of random arrangements. Alternatively, as described in EP Patent Publication No. 0,804,037, (A2), a digital halftone technology in which colors are equally randomly distributed in a local region may be applied.

As used herein, the term "randomly" does not necessarily mean "completely randomly", but may mean "pseudo-randomly". That is, repetition may occur over a long cycle.

Additionally, the occurrence frequency of a color in the end portions (the upper, lower, left, and light portions) of the filter arrangement may be computed while taking into account a space in which the upper end is connected to the lower end of the arrangement and the left end is connected to the right end of the arrangement. Alternatively, if the filter arrangement is sufficiently large compared with a predetermined area size, the end portions may be negligible.

The color filter arrangement shown in FIG. 3 is a five-color filter arrangement in which the color filters C1 are arranged in a checkered pattern and the color filters C2, C3, C4, and C5 are randomly arranged at positions at which the color filters C1 are not present. The area having a predetermined size is a rectangle of 15 by 15 pixels. The occurrence frequency of the color filters C1 is determined as a ratio of 1/2 whereas the occurrence frequency of each of the color filters C2, C3, C4, and C5 are determined as a ratio of 1/8. The error of the occurrence frequency is determined to be ±1/50.

In addition, according to a first modification of the present exemplary embodiment, a color filter arrangement is a four-color filter arrangement in which first color filters C1 are arranged in a checkered pattern, second color filters C2 are arranged at positions at which the color filters C1 are not present on every other line in a horizontal direction and in a vertical direction, and third color filters C3 and fourth color filters C4 are randomly arranged at positions at which neither the color filters C1 nor C2 are present.

In such a filter arrangement, the color filters C1 and C2 are regularly arranged whereas the color filters C3 and C4 are randomly arranged.

The color filters C1 correspond to a number of pixels about half the total number of pixels of the imaging device. The color filters C2 correspond to a number of pixels about one fourth of the total number of pixels of the imaging device.

The color filters C3 and C4 totally correspond to a number of pixels only one fourth of the total number of pixels of the imaging device. Accordingly, when the numbers of pixels having the color filters C3 is substantially the same as the number of pixels having the color filters C4, the number of the color filters C3 or C4 is about one eighth of the total number of pixels of the imaging device. Therefore, the resolution is low and a false color easily occurs. However, by randomly arranging the color filters C3 and C4, the occurrence of a false color can be reduced.

In addition, in the above-described color filter arrangement according to the first modification, for example, the correlation between the spectral sensitivities of the color filters C3 and C4 is high.

In such a color filter arrangement, let the color filter C1 represent the G color, the color filters C2 represent the R color, the color filters C3 represent the B color, and the color filters C4 represent a B' color having a spectral sensitivity close to that of the B color. Then, this color filter arrangement is considered to be an arrangement in which filters related to the B and B' colors are randomly arranged at the positions of filters related to the B color of the Bayer arrangement.

Hereinafter, this arrangement is referred to as a "four-color G checkered random arrangement". The four-color G checkered random arrangement is shown in FIG. 4.

Most techniques such as a dumping readout method or a summing readout method for reading out signals from solid-state imaging devices are proposed on the basis of the Bayer arrangement. In these techniques, the arrangement obtained after the signals are read out is also the Bayer arrangement.

Figure 5:
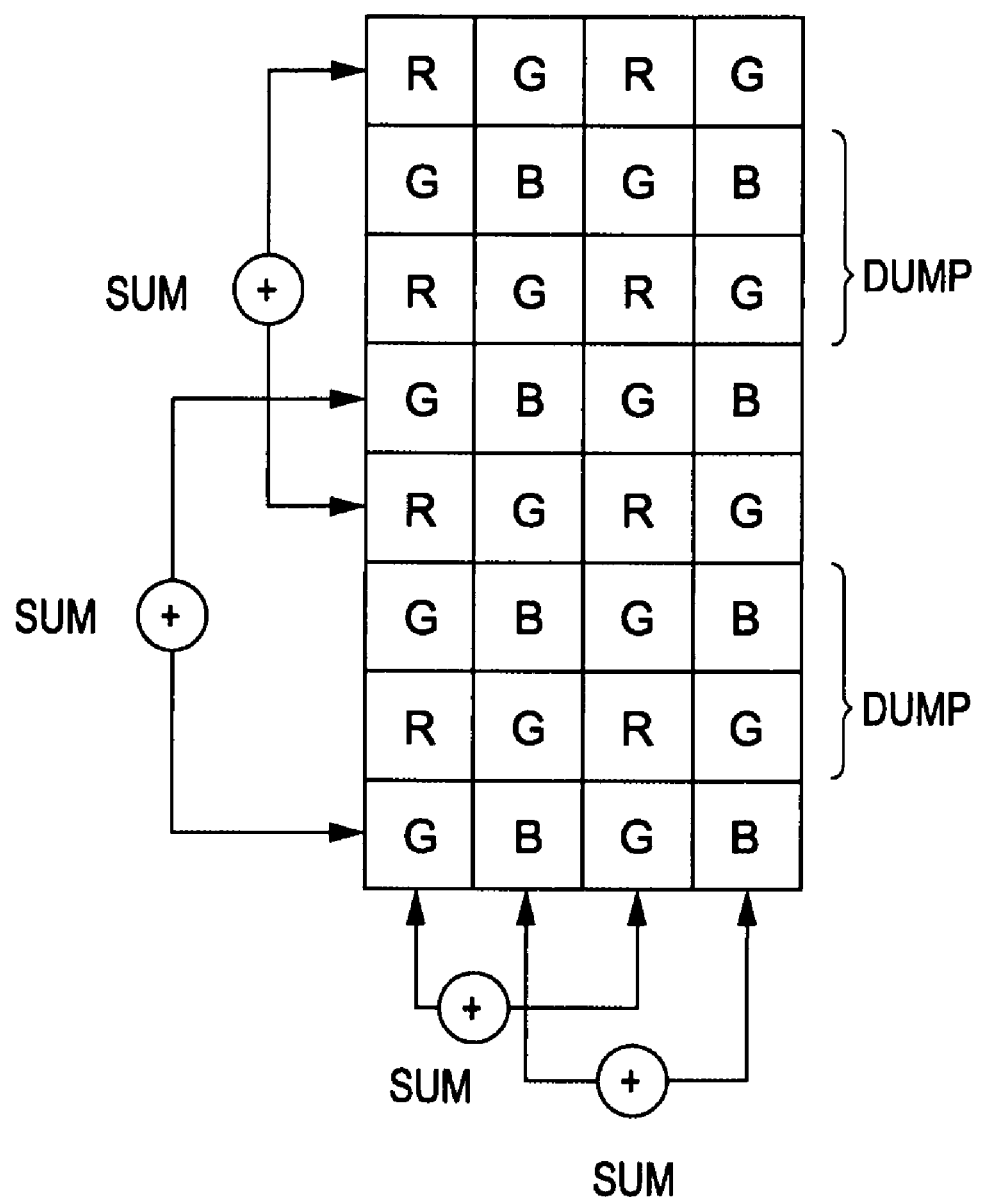
FIG. 5 illustrates an example in which signals are read out from a solid-state imaging device using a combination of the dumping readout technique and the summing readout technique.

FIG. 5 illustrates an example in which signals are read out from a solid-state imaging device at high speed using a combination of the dumping readout method and the summing readout method.

In this example, four lines out of eight vertical lines are dumped. In addition, in the horizontal direction, the same color signals are summed while skipping every other line. In the vertical direction, the same color signals are summed while skipping every three lines.

When such a known readout method is applied to the four-color G checkered random arrangement, it is apparent that, according to the dumping readout method, a four-color G checkered random arrangement is generated after the readout operation is performed.

It is more desirable if the arrangement is determined in advance so that the above-described condition of the occurrence frequency is satisfied even after the dumping readout operation is performed.

In the case of the summing readout method, the same condition as the Bayer arrangement is maintained for the G and R color signals. However, the B' and B color signals are summed with no distinction and the summed signal is output.

For example, when four pixels are summed, there are five cases as follows:

(1) Four B-color pixels and zero B'-color pixels are summed;

(2) Three B-color pixels and one B'-color pixel are summed;

(3) Two B-color pixels and two B'-color pixels are summed;

(4) One B-color pixel and three B'-color pixels are summed; and (5) Four B-color pixels and zero B'-color pixels are summed.

That is, even in a single-color region, pixel values obtained at positions of the B color of the Bayer arrangement are different depending on the numbers of the B colors and the B' colors.

However, let B" denote a new color obtained by mixing the pixel values of the B color and the B' color in proportion to the occurrence frequency of color described referring to the color filter arrangement generated from the color separation computation of this embodiment. Then, the arrangement obtained by the summing readout method can be considered to be the Bayer arrangement of the R, G, and B" color filters.

In the color separation process of the Bayer arrangement, if only low-frequency components of the R and B color signals are known, the R and B color signals containing high-frequency components can be estimated using the G color signal as a reference.

For example, let G(p) denote the pixel value of the G color at a pixel location p, and let $G_{low}(p)$ and $B_{low}(p)$ respectively denote the low-frequency components of the G and B color signals. Then, a pixel value B(p) of the B color can be estimated using the following equation:

$$B(p) = \frac{B_{low}(p)}{G_{low}(p)} G(p) \quad (1)$$

The low-frequency component is obtained by averaging the G color signals or the B color signals from pixels that are present in the vicinity of the pixel location p. In the greater part of an RGB image, the pixels values of the R, G, and B colors have a strong positive correlation.

Accordingly, as shown in FIG. 6, when the pixels that are present in a local region are plotted in a space where the abscissa represents the pixel value of the G color and the ordinate represents the pixel value of the B color, the pixels are distributed within a limited small region.

This distribution is approximated by a linear regression line passing through the origin and the center point of the distribution, that is, by a line indicated by equation (1).

Here, a computation method used for obtaining a low-frequency component of the B color signal in the Bayer arrangement is applied to the arrangement obtained by the summing readout method.

In this computation method, the sum of the B and B' color signals are further averaged in a given local region.

When considered from a computation for an arrangement before summing is performed, this computation only involves averaging of the B and B' color signals from the pixels that are present in the vicinity of the pixel location p.

Since the spectral sensitivity of the B color filter is close to that of the B' color filter, it is expected that the both color filters have substantially the same frequency characteristic for the same incident light pattern. Furthermore, if the local region is sufficiently large, it is expected that the ratio of the number of pixels of the summed B color to that of the summed B' color is close to the above-described occurrence frequency.

According to this feature, the low-frequency component of the B" color signal in the Bayer arrangement of the R, B, and B" color filters can be approximated using the arrangement obtained by the summing readout method.

If the low-frequency component of the B" color signal is obtained, the pixel value of the B" color can be estimated using the G color as a reference, as indicated by equation (1). Accordingly, the arrangement obtained by the summing readout method can be used in place of the Bayer arrangement of the R, G, and B" color filters.

Similarly, in the case where the dumping readout method is combined with the summing readout method, the obtained arrangement can be used in place of the Bayer arrangement of the R, G, and B" color filters.

According to a second modification of the present exemplary embodiment, a color filter arrangement is a five-color filter arrangement in which first color filters C1 are arranged in a checkered pattern, second color filters C2 and third color filters C3 are randomly arranged at positions at which the color filters C1 are not present on every other line in a horizontal direction and in a vertical direction, and fourth color filters C4 and fifth color filters C5 are randomly arranged at positions at which neither the color filters C1 nor C2 nor C3 are present.

In such a filter arrangement, by increasing the number of colors of the filter arrangement, the performance of color reproduction and the dynamic range can be further increased.

In the color filter arrangement according to the second modification, for example, the correlation of spectral sensitivity between the color filters C2 and C3 may be set to be high, and the correlation of spectral sensitivity between the color filters C4 and C5 may be set to be high.

In such a color filter arrangement, for example, let the color filter C1 represent the G color, the color filter C2 represent the R color, the color filter C3 represent the R' color having the sensitivity close to that of the R color filter, the color C4 represent the B color, and the color filter C5 represent a B' color having the spectral sensitivity close to that of the B color filter. Then, this color filter arrangement is considered to be an arrangement in which the R and R' color filters are randomly arranged at the positions of the A color filters of the Bayer arrangement, and the B and B' color filters are randomly arranged at the positions of the B color filter of the Bayer arrangement.

Hereinafter, this arrangement is referred to as a "five-color G checkered random arrangement". The five-color G checkered random arrangement is shown in FIG. 7.

In the case where the dumping readout method or the summing readout method is applied to the five-color G checkered random arrangement, let R" denote a new color obtained by mixing the pixel values of the R color and the R' color in proportion to the occurrence frequency of a color filter described referring to the color filter arrangement of this embodiment, and let B" denote a new color obtained by mixing the pixel values of the B color and the B' color in proportion to the occurrence frequency of a color filter described referring to the color filter arrangement of this embodiment. Then, the arrangement obtained after reading out the signals can be considered to be the Bayer arrangement of the R", G, and B" color filters.

An image capturing apparatus (a digital video camera) using the color filter arrangement according to the above-described embodiment is described next.

Figure 8:
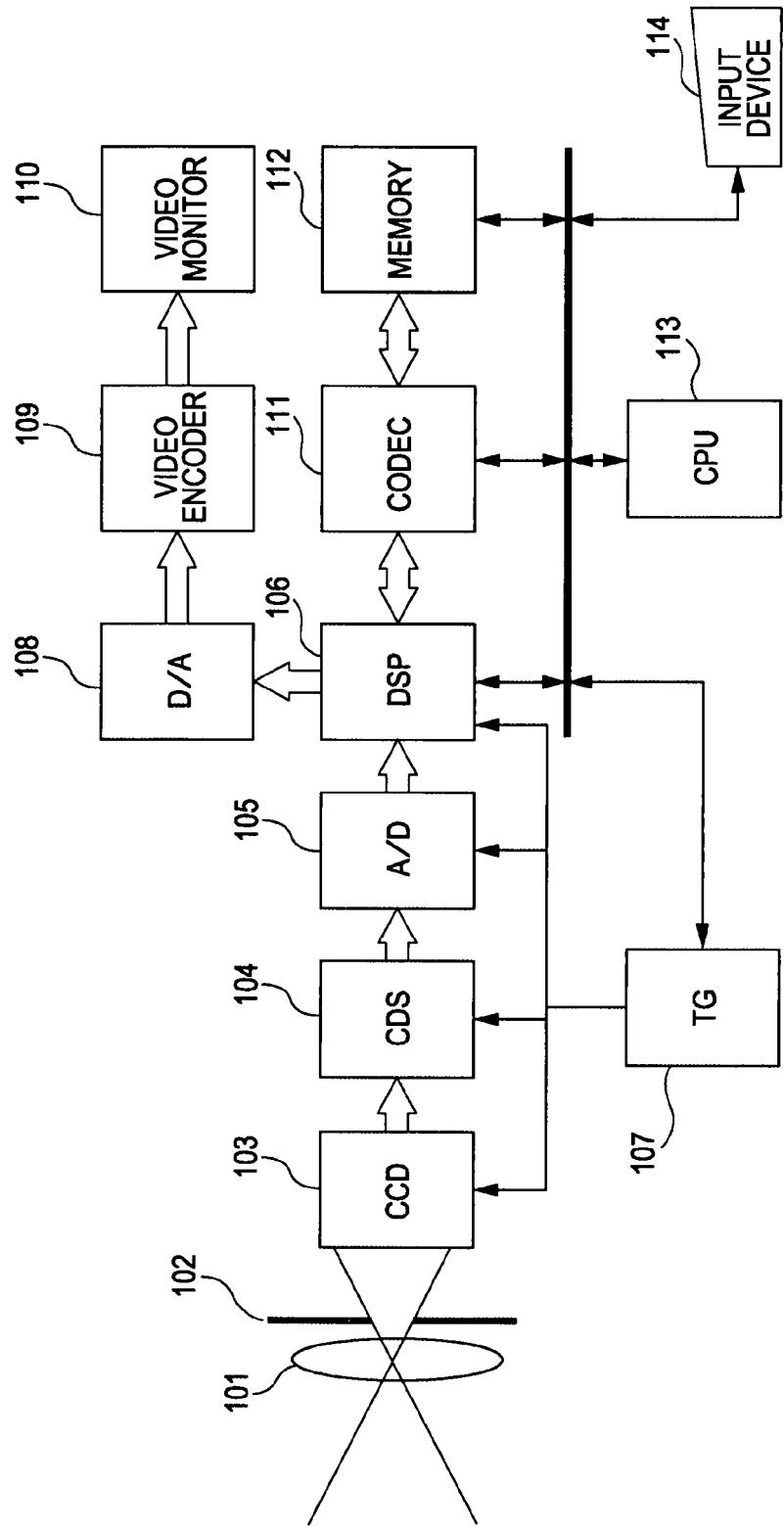
FIG. 8 is a block diagram of an exemplary structure of a digital video camera according to an embodiment of the present invention.

FIG. 8 is a block diagram of an exemplary structure of a digital video camera 100 according to an embodiment of the present invention.

As shown in FIG. 8, the digital video camera 100 includes a lens 101, an aperture 102, a charge-coupled device (CCD) image sensor 103, a correlated double sampling circuit 104, an A/D converter 105, a digital signal processor (DSP) block 106, a timing generator 107, a D/A converter 108, a video encoder 109, a video monitor 110, a coder decoder (CODEC) 111, a memory 112, a central processing unit (CPU) 113, and an input device 114.

Here, the input device 114 includes operation buttons, such as a recording button mounted on the body of the digital video camera 100.

The DSP block 106 is a block including a signal processing processor and an image RAM (an image memory). The signal processing processor can perform a pre-programmed process on image data stored in the RAM. Hereinafter, the DSP block is simply referred to as a "DSP".

Incident light arrived at the CCD image sensor 103 through an optical system is received by each of light receiving elements on the image plane of the CCD image sensor 103. The light receiving elements photoelectrically convert the incident light to an electrical signal. The correlated double sampling circuit 104 removes noise in the electrical signal. The A/D converter 105 digitizes the electrical signal. Thereafter, the DSP 106 temporarily stores the signal in the image memory.

During capturing an image, the timing generator 107 controls a signal processing system to capture the image at a constant frame rate. A pixel stream is transferred to the DSP 106 at a constant rate. The DSP 106 performs appropriate image processing on the pixel stream and delivers image data to the D/A converter 108 or the CODEC 111 or the both.

The D/A converter 108 converts the image data delivered from the DSP 106 to an analog signal. Thereafter, the video encoder 109 converts the analog signal to a video signal. A user can monitor the video signal through the video monitor 110. The video monitor 110 serves as a finder of the camera according to the present exemplary embodiment.

The CODEC 111 encodes the image data delivered from the DSP 106 and stores the encoded image data in the memory 112. The memory 112 may be replaced with a recording unit using a semiconductor, a magnetic recording medium, a magneto optical recording medium, or an optical recording medium.

The digital video camera according to the present exemplary embodiment includes such components. The feature of the above-described embodiment is applied to image processing performed by the DSP 106. This image processing is described in detail next.

As noted above, according to the present exemplary embodiment, an image processing unit is realized by using the DSP 106. Accordingly, in the configuration of the present exemplary embodiment, the operation of the image processing unit is realized by an arithmetic unit in the DSP 106 that sequentially performs computation described in predetermined program code on the input stream of the image signal.

In the following description, each of the processing modules of the program code is described as a functional block, and the sequence of performing the modules is described using a flow chart. However, in addition to a program described below, the present invention can be realized by a hardware circuit that performs processes that are the same as the following processes.

Here, an on-chip color filter array of the CCD image sensor 103 employs the filter arrangement according to the above-described embodiment of the present invention. In the temporarily stored image, each pixel has only one color. The DSP 106 processes this image in accordance with a prestored image processing program so as to generate image data in which each pixel has a full color.

According to the present exemplary embodiment, description is made with reference to image processing on a mosaic image obtained from the five-color G checkered random arrangement shown in FIG. 7.

The G pixel values at all of pixel locations are computed using the G pixel values obtained in a checkered pattern.

Subsequently, using the G pixel value as a reference, R, R', B, and B' pixel values are interpolated for all the pixel locations.

Thereafter, the MS-SyncNR is applied to an image in which pixel values of all the colors are allocated to all the pixel locations so that the occurrence of a false color is eliminated.

Figure 9:
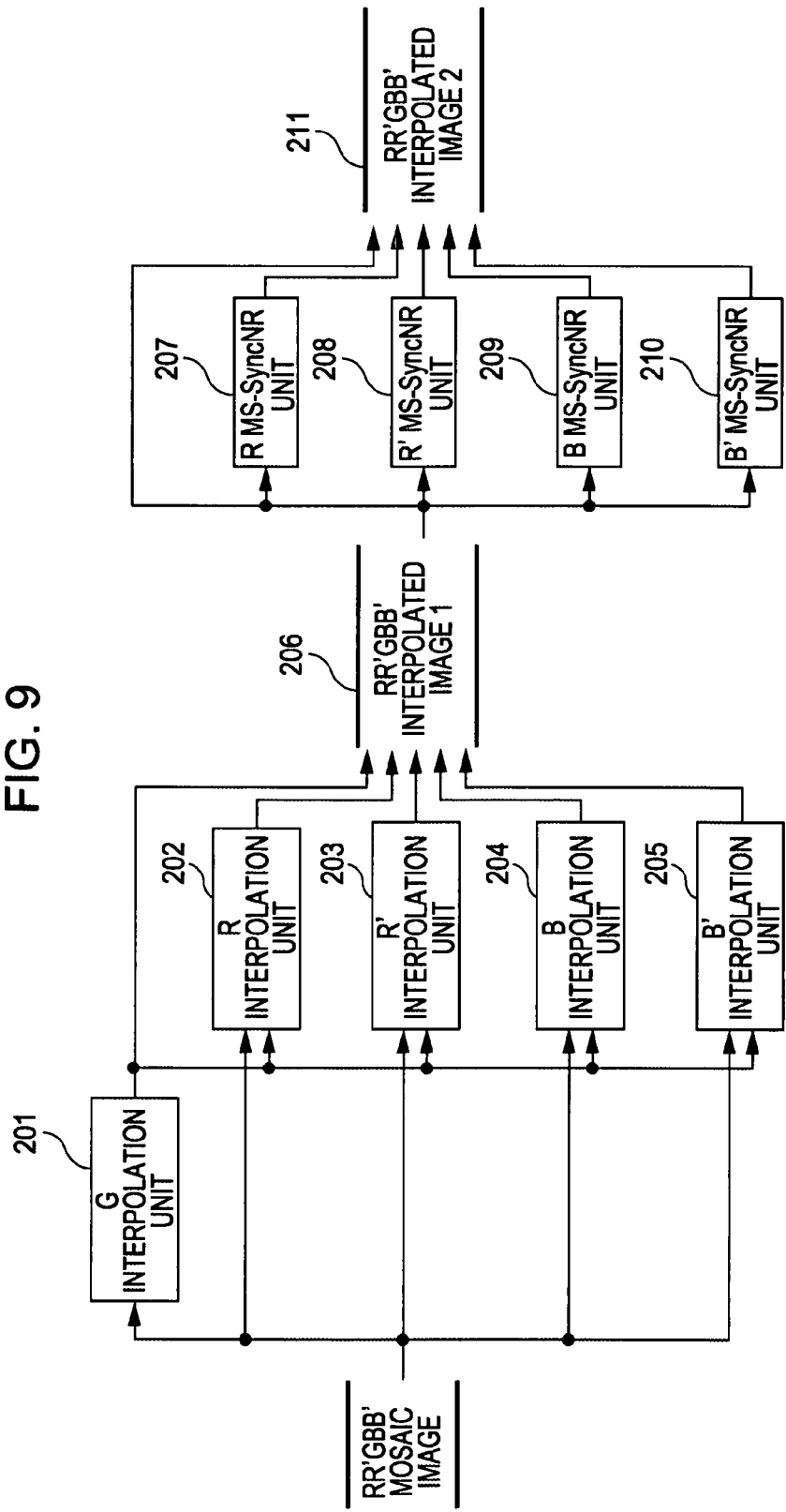
FIG. 9 is a block diagram of processing of an image processing unit shown in FIG. 8 according to the embodiment of the present invention.

FIG. 9 is a block diagram of the image processing unit according to the present exemplary embodiment. The RR'GBB' mosaic image obtained from the five-color G checkered random arrangement is input to the image processing unit. A G interpolation unit 201, an R interpolation unit 202, an R' interpolation unit 203, a B interpolation unit 204, and a B' interpolation unit 205 generate a first RR'GBB' interpolated image 206 which is an image in which pixel values of all the color are interpolated at all the pixel locations. In addition, an R MS-SyncNR unit 207, an R' MS-SyncNR unit 208, a B MS-SyncNR unit 209, and a B' MS-SyncNR unit 210 process this first RR'GBB' interpolated image 206 so as to generate a second RR'GBB' interpolated image 211 as a final output.

G Interpolation Unit

In the G interpolation unit 201, the G pixel value is interpolated at all the pixel locations.

Since the number of G color pixels is large compared with the other color pixels, a high-resolution interpolated image can be obtained even when a simple interpolation method, such as the Bicubic method, is applied.

Here, description is made using the method described in Japanese Patent No. 2931520 entitled "Color Separation Circuit of Single-plate Color Video Camera", which is one of interpolation methods effective for the arrangement having a checkered G color pattern.

Figure 10:
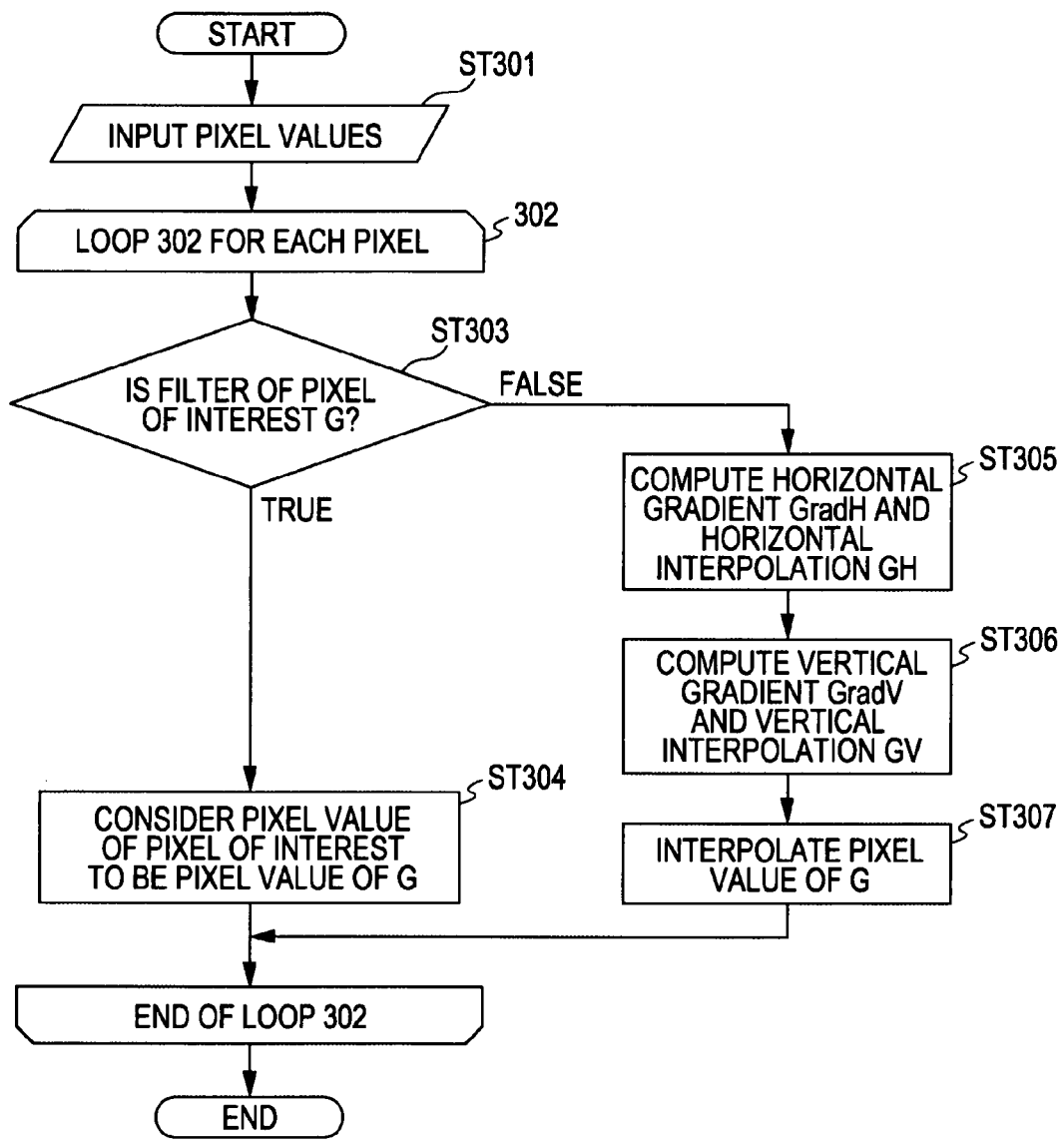
FIG. 10 is a flow chart of a process performed by a G interpolation unit shown in FIG. 9.

FIG. 10 is a flow chart of a process performed by the G interpolation unit 201 shown in FIG. 9.

Hereinafter, description is made with reference to this flow chart.

In a loop 302, the G interpolation unit 201 repeatedly performs a process for each of the pixel locations. As used herein, a pixel that is subjected to the process in one loop is referred to as a "pixel of interest".

At step ST301, the G interpolation unit 201 reads out the pixel values of pixels in the vicinity of a pixel of interest in the mosaic image.

Subsequently, at step ST303, the G interpolation unit 201 determines whether the filter color at the location of the pixel of interest is G.

If, at step ST303, the G interpolation unit 201 determines that the filter color at the location of the pixel of interest is G, the processing proceeds to step ST304, where the pixel value of the pixel of interest is considered to be a G color pixel value.

However, if, at step ST303, the G interpolation unit 201 determines that the filter color at the location of the pixel of interest is not G, the processing proceeds to step ST305.

At step ST305, the G interpolation unit 201 computes a horizontal gradient GradH using the following equation:

$$GradH = |M(x-1,y) - M(x+1,y)| \qquad (2)$$

where M(x, y) represents the pixel value at a location (x, y) of the pixel of interest.

Subsequently, the G interpolation unit 201 computes a horizontal interpolation GH using the following equation:

$$GH = \frac{M(x-1, y) + M(x+1, y)}{2} \qquad (3)$$

In the same manner, at step ST306, the G interpolation unit 201 computes a vertical gradient GradV using the following equation:

$$GradH = |M(x,y-1) - M(x,y+1)| \qquad (4)$$

Subsequently, the G interpolation unit 201 computes a vertical interpolation GV using the following equation:

$$GV = \frac{M(x, y-1) + M(x, y+1)}{2} \qquad (5)$$

At step ST307, the G interpolation unit 201 interpolates a pixel value of the G color G(x, y) of the pixel of interest using GradH, GradV, GH, and GV according to the following equation:

$$G(x, y) = \frac{GradV}{GradH + GradV} GH + \frac{GradH}{GradH + GradV} GV \qquad (6)$$

$$G(x, y) = \frac{GradV}{GradH + GradV} GH + \frac{GradH}{GradH + GradV} GV$$

The interpolation process of the G pixel value of the pixel of interest is completed when the process at step ST304 or ST307 is completed. Thereafter, the next loop process for the location of the next pixel of interest starts. If the loop process for all the pixels is completed, the processing exits the loop 302. Thus, the process performed by the G interpolation unit 201 is completed.

R Interpolation Unit 202, R' Interpolation Unit 203, B Interpolation Unit 204, and B' Interpolation Unit 205

The processes performed by the R interpolation unit 202, the R' interpolation unit 203, the B interpolation unit 204, and the B' interpolation unit 205 are similar except regarding the target color. Accordingly, description is made with reference to only the R interpolation unit 202. Descriptions of the R' interpolation unit 203, the B interpolation unit 204, and the B' interpolation unit 205 can be obtained by replacing the symbol "R" in the description of the R interpolation unit 202 with "R'", "B", and "B'", respectively.

Figure 11:
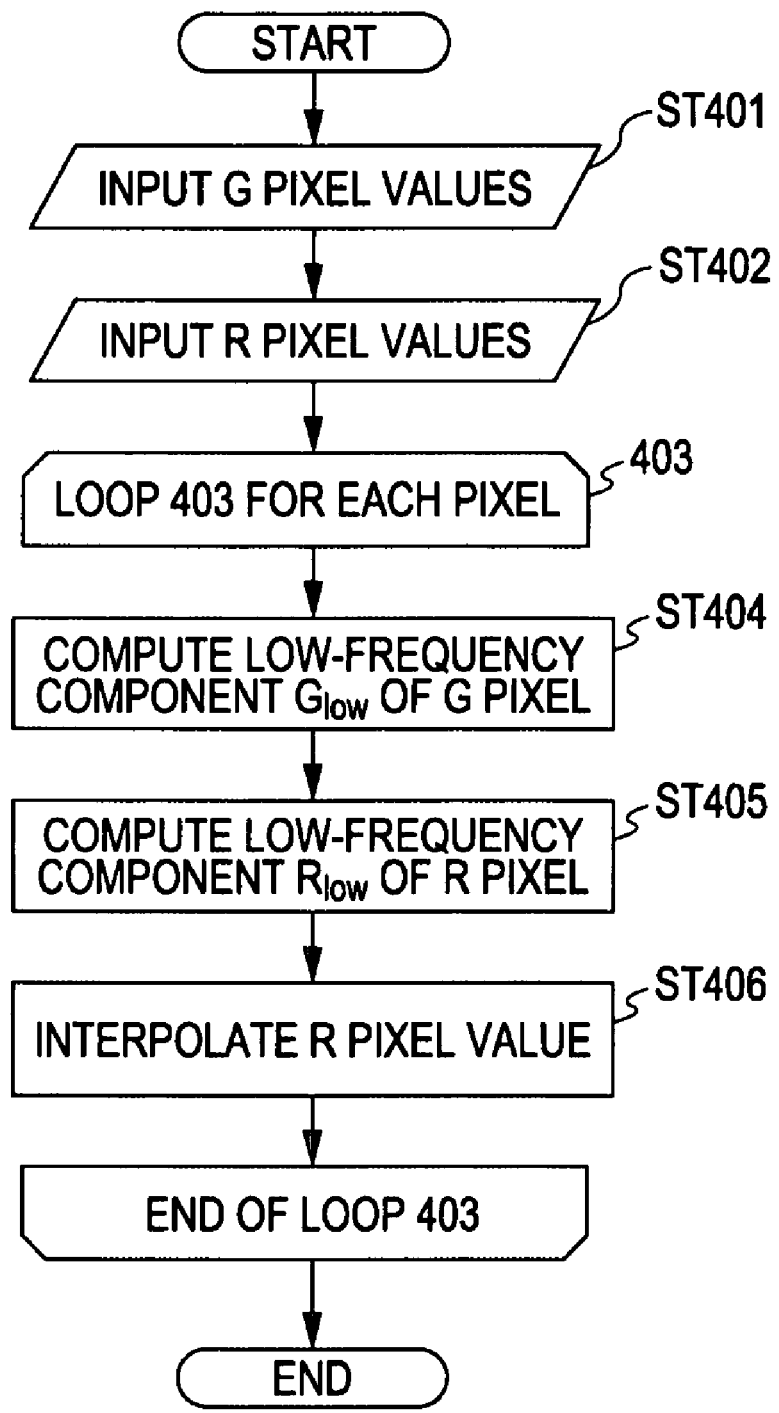
FIG. 11 is a flow chart of a process performed by an R interpolation unit shown in FIG. 9.

FIG. 11 is a flow chart of a process performed by the R interpolation unit 202 shown in FIG. 9. Hereinbelow, a procedure is described with reference to this flow chart.

In a loop 403, the R interpolation unit 202 repeatedly performs a process for each of the pixel locations. As used herein, a pixel that is subjected to the process in one loop is referred to as a "pixel of interest".

At step ST401, the R interpolation unit 202 reads out the G pixel values of the pixels in the vicinity of a pixel of interest. Note that the pixel values were computed by the G interpolation unit 201 shown in FIG. 9.

In addition, at step ST402, the R interpolation unit 202 reads out the pixel values of pixels in the vicinity of the pixel of interest in the RR'GBB' mosaic image.

Subsequently, at step ST404, the R interpolation unit 202 computes a low-frequency component $G_{low}$ of the G color pixel, which is the pixel of interest. At step ST405, the R interpolation unit 202 computes a low-frequency component $R_{low}$ of the R color pixel, which is the pixel of interest.

At step ST406, the R interpolation unit 202 interpolates an R pixel value R(x, y) of the pixel of interest using $G_{low}$ and $R_{low}$, according to the following equation:

$$R(x, y) = \frac{R_{low}}{G_{low}} G(x, y) \qquad (7)$$

The interpolation process of the R pixel value of the pixel of interest is completed when the process at step ST406 is completed. Thereafter, the next loop process for the location of the next pixel of interest starts. If the loop process for all the pixels is completed, the processing exits the loop 403. Thus, the process performed by the R interpolation unit 202 is completed.

Figure 12A:
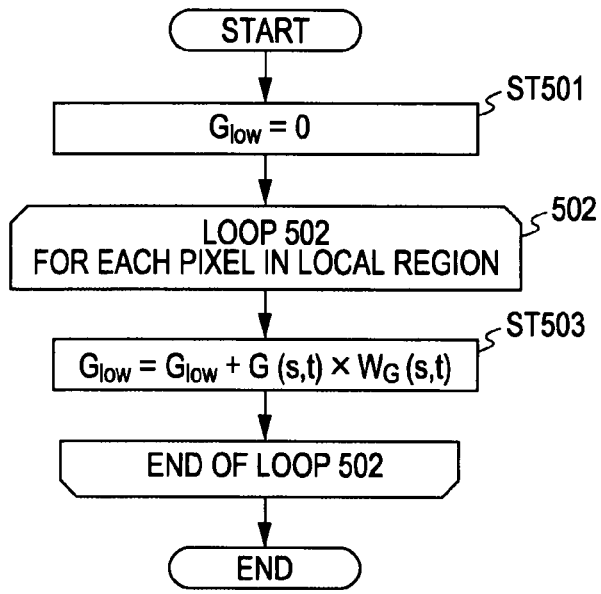
FIGS. 12A and 12B are flow charts of processes performed at step ST404 and ST405 shown in FIG. 11, respectively.

FIG. 12A is a flow chart of a detailed process performed at step ST404 shown in FIG. 11.

In this process, the G color pixels contained in a local region are averaged. That is, a low-pass filter using a finite impulse response (FIR) filter is formed.

At step ST501, the R interpolation unit 202 initializes $G_{low}$ to zero.

Subsequently, at step ST502, the R interpolation unit 202 performs a loop process for each of the locations of all the pixels in a local region including the pixel of interest.

As used herein, the term "local region" refers to the above-described region having the predetermined size.

Additionally, a pixel that is subjected to the process in one loop is referred to as a "pixel of interest in the local region".

At step ST503, the R interpolation unit 202 multiplies G(s, t) by WG(s, t). Thereafter, the resultant value is added to $G_{low}$. The resultant value is considered to be a new value of $G_{low}$.

Here, G(s, t) denotes the pixel value of G color at the location (s, t) of a pixel of interest in the local region. WG(s, t) denotes a weighting coefficient.

WG(s, t) is determined to be a coefficient for a low-pass filter and the sum of the coefficients is 1.

The process for the pixel of interest in the local region is completed when the process at step ST503 is completed. Thereafter, the next loop process for the next pixel of interest in the local region starts. If the loop process for all the pixels in the local region is completed, the processing exits the loop 502. Thus, the process performed by the R interpolation unit 202 at step ST404 is completed.

Figure 12B:
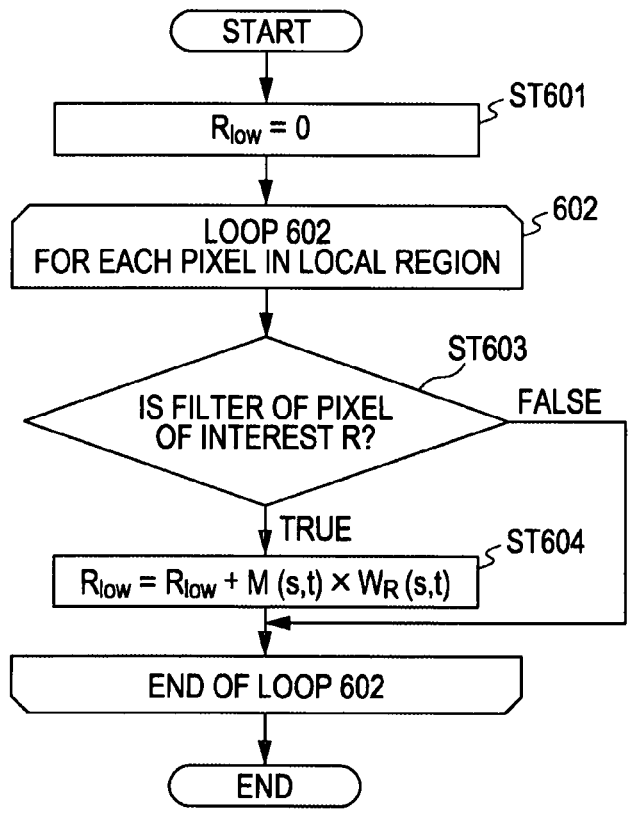

FIG. 12B is a flow chart of a detailed process performed at step ST405 shown in FIG. 11.

In this process, the R color pixels contained in the local region are averaged. That is, a low-pass filter using an FIR filter is formed.

At step ST601, the R interpolation unit 202 initializes a variable $R_{low}$ to 0.

Thereafter, in a loop 602, the R interpolation unit 202 performs a loop process for each of the locations of all the pixels in a local region including the pixel of interest.

Here, the local region refers to the above-described region having the predetermined size.

At step ST603, the R interpolation unit 202 determines whether the filter color at the location of the pixel of interest in the local region is R.

If, at step ST603, the R interpolation unit 202 determines that the filter color at the location of the pixel of interest is R, the processing proceeds to step ST604, where M(s, t) is multiplied by WR(s, t). The resultant value is added to $R_{low}$. Then, the resultant value is considered to be a new value of $R_{low}$.

Here, M(s, t) denotes the pixel value at the location (s, t) of a pixel of interest in the local region. WR(s, t) denotes a weighting coefficient.

WR(s, t) is determined to be a coefficient for a low-pass filter and the sum of the coefficients is 1.

However, since the R color pixels are randomly arranged, a different WR(s, t) is used in accordance with the position of the R color pixels in the local region.

In addition, it is desirable that WR(s, t) is determined so that the characteristics of the low-pass filter composed of WR(s, t) are close to those of a low-pass filter composed of WG(s, t).

The process for this pixel of interest in the local region is completed when the process at step ST604 is completed. Thereafter, the next loop process for the next pixel of interest in the local region starts. If the loop process for all the pixels in the local region is completed, the processing exits the loop 602. Thus, the process performed by the R interpolation unit 202 at step ST405 is completed.

R MS-SyncNR Unit 207, R' MS-SyncNR Unit 208, B MS-SyncNR Unit 209, and B' MS-SyncNR Unit 210

The processes performed by the R MS-SyncNR unit 207, the R' MS-SyncNR unit 208, the B MS-SyncNR unit 209, and the B' MS-SyncNR unit 210 are similar except regarding the target color. Accordingly, description is made with reference to only the R MS-SyncNR unit 207. Descriptions of the R' MS-SyncNR unit 208, the B MS-SyncNR unit 209, and the B' MS-SyncNR unit 210 can be obtained by replacing the symbol "R" in the description of the R MS-SyncNR unit 207 with "R'", "B", and "B'", respectively.

Figure 13:
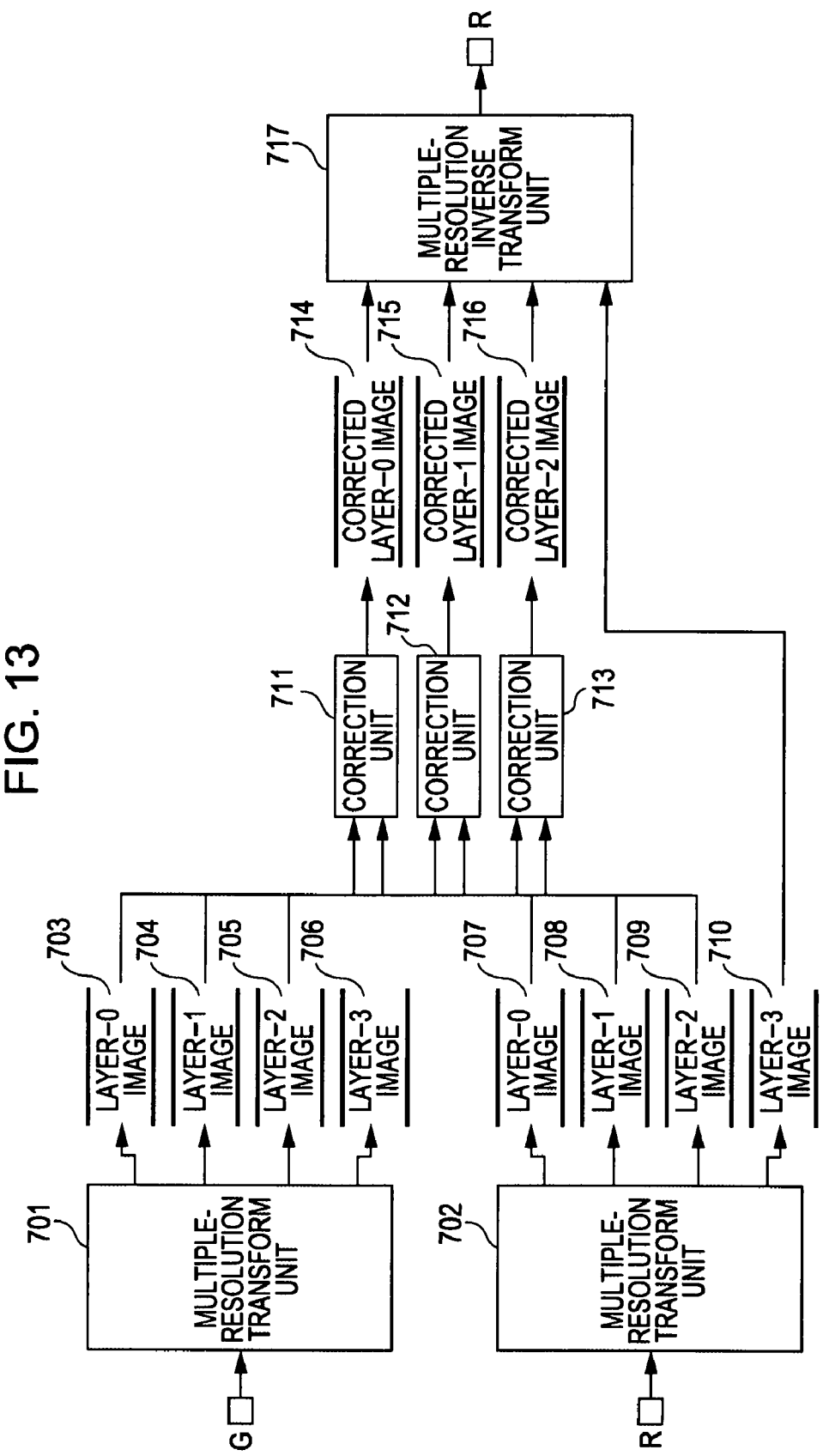
FIG. 13 is a block diagram of a detailed structure of an R MS-SyncNR unit 207 shown in FIG. 9.

FIG. 13 is a block diagram of a detailed structure of the R MS-SyncNR unit 207 shown in FIG. 9.

In the structure shown in FIG. 13, two G and R channels receive signals, and noise is removed from the R color signal. Thereafter, an output signal without noise is output from the structure. If a component that has no correlation with the R color signal is removed from the G color signal, the occurrence of a false color is eliminated. Accordingly, in the present exemplary embodiment, noise is not removed from the G color signal. However, in practical applications, it is desirable that noise is removed from the G color signal using some noise removing method and, subsequently, noise is removed from the R color signal by the method according to the present exemplary embodiment.

The R MS-SyncNR unit 207 includes two multiple-resolution transform units 701 and 702, a multiple-resolution inverse transform unit 717, and correction units 711, 712, and 713. Note that the number of correction units (three in FIG. 13) is determined by subtracting one from the number of layers of the multiple resolutions. The first multiple-resolution transform unit 701 converts an image input from the G channel to multiple-resolution image data. Thereafter, the multiple-resolution transform unit 701 stores image signals corresponding to the layers of the multiple resolutions in memories 703, 704, 705, and 706.

Similarly, the second multiple-resolution transform unit 702 converts an image input from the R channel to multiple-resolution image data. Thereafter, the multiple-resolution transform unit 702 stores image signals corresponding to the layers of the multiple resolutions in memories 707, 708, 709, and 710.

The correction units 711, 712, and 713 correspond to layers other than the layer of the minimum resolution. Each of the correction units 711, 712, and 713 receives images of the G and R channels in the corresponding layer, corrects each of the pixels of the images that contain noise so as to generate an R channel image without noise, and stores the generated R channel image in the corresponding one of image memories 714, 715, and 716.

The correction units 711, 712, and 713 are described in more detail next.

Since the correction units 711, 712, and 713 have a similar configuration and operate in a similar manner, only the correction unit 711 is described here.

Figure 14:
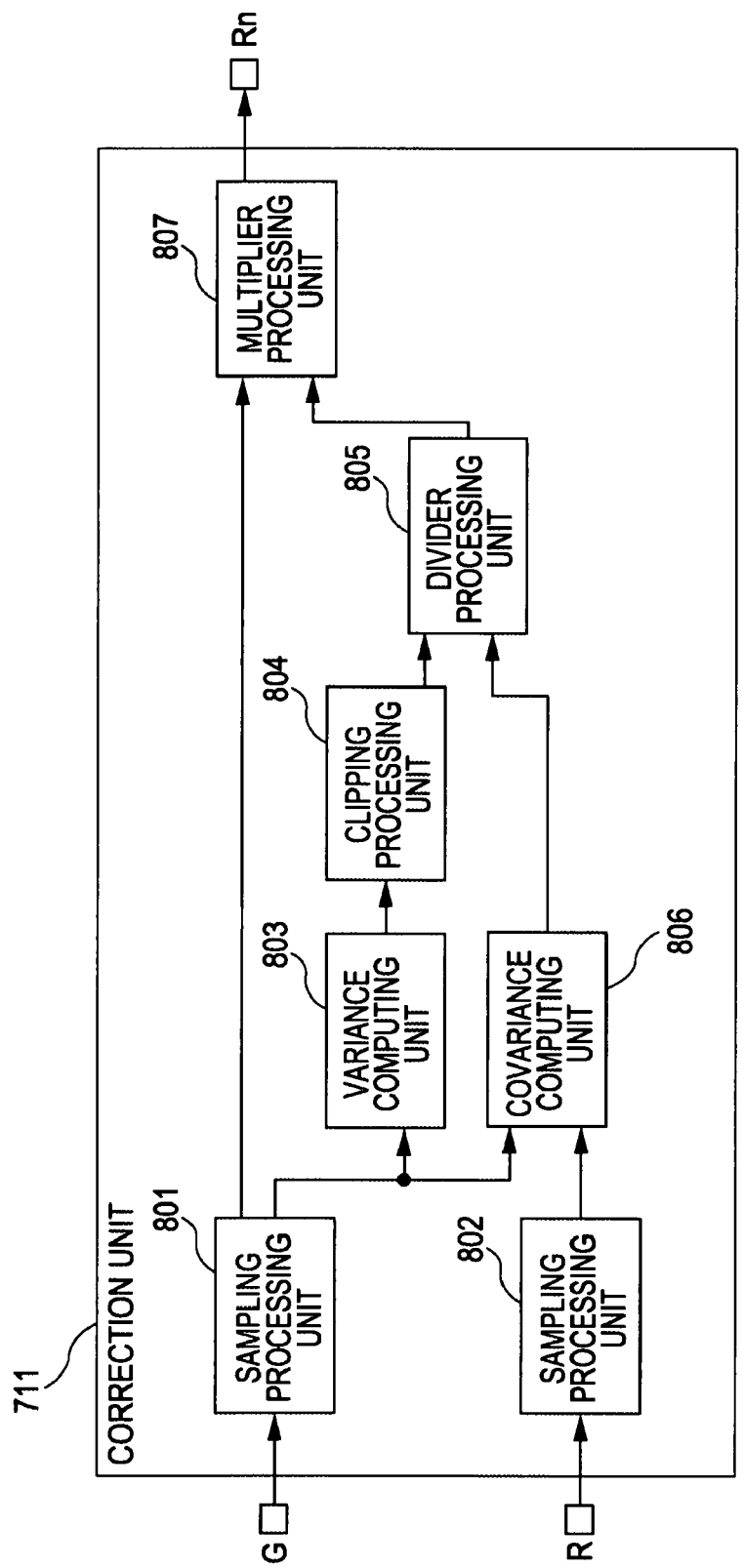
FIG. 14 is a block diagram illustrating an exemplary configuration of a correction unit.

FIG. 14 is a block diagram illustrating an exemplary configuration of the correction unit 711.

As shown in FIG. 14, the correction unit 711 includes sampling processing units 801 and 802, a variance computing unit 803, a clipping processing unit 804, a divider processing unit 805, a covariance computing unit 806, and a multiplier processing unit 807.

The sampling processing unit 801 samples (extracts) a plurality of G channel pixel values from pixels in the vicinity of a predetermined location determined corresponding to the location of a pixel of interest. The sampling processing unit 801 then delivers the sampled G channel pixel values to the multiplier processing unit 807, the variance computing unit 803, and the covariance computing unit 806. The sampling processing unit 802 samples (extracts) a plurality of R channel pixel values from pixels in the vicinity of a predetermined location determined corresponding to the location of a pixel of interest. The sampling processing unit 802 then delivers the sampled R channel pixel values to the covariance computing unit 806. Note that the sampling processing units 801 and 802 extract the G pixel value and the R pixel value at the same location determined corresponding to the position of the pixel of interest.

The variance computing unit 803 computes the variance of the G pixel values in the vicinity of the pixel of interest on the basis of the sampled G pixel values. Thereafter, the variance computing unit 803 delivers the computed variance to the clipping processing unit 804.

The covariance computing unit 806 computes the covariance of the G pixel values and the R pixel values on the basis of the sampled G and R pixels values. The covariance computing unit 806 then delivers the computed covariance to the divider processing unit 805. If the variance of the samples of the G channel is less than a predetermined threshold value, the clipping processing unit 804 clips the variance to the predetermined threshold value and delivers that value to the divider processing unit 805. The divider processing unit 805 divides the covariance delivered from the covariance computing unit 806 by the variance delivered from the clipping processing unit 804. Thus, the divider processing unit 805 delivers the ratio of the covariance to the variance (i.e., the covariance/the variance) to the multiplier processing unit 807. The above-described process performed by the clipping processing unit 804 prevents the occurrence of the ratio of zero when the divider processing unit 805 performs the subsequent process (i.e., the computation of the covariance/the variance). By multiplying the value (the computation of the covariance/the variance) by the G channel pixel value at the location of the pixel of interest, the multiplier processing unit 807 estimates the R channel pixel value of the pixel of interest without noise and outputs the estimated value.

The operations of the correction units 711, 712, and 713 are described in detail next.

The correction units 711, 712, and 713 correct pixel values by a pixel value estimation method using a correlation between channels. More specifically, on ground that there is a linear relationship between two channels (e.g., G and R) when focusing on a local region, the estimation value of R at a pixel location in the local region is obtained by a linear regression computation.

For example, when samples $\{C_{11}, C_{12}, C_{13}, \ldots C_{1N}\}$ of the pixel values of a $C_1$ channel (e.g., a G color channel) and samples $\{C_{21}, C_{22}, C_{23}, \ldots C_{2N}\}$ of the pixel values of a $C_2$ channel (e.g., an R color channel) are acquired in the local region around the pixel of interest in an image and there is a linear relationship between the two channel, a luminance estimation value $C_{2c}'$ of the $C_2$ channel at the location of the pixel of interest can be obtained using a luminance estimation value $C_{1C}$ of the $C_1$ channel at the location of the pixel of interest according to the following equation:

$$C_{2c}' = \frac{V_{C_1 C_2}}{V_{C_1 C_1}} (C_{1c} - M_{C_1}) + M_{C_2} \qquad (8)$$

where $M_{C1}$ denotes the expectation value of the $C_1$ channel in the local region, $M_{C2}$ denotes the expectation value of the $C_2$ channel, $V_{C1C2}$ is the covariance of the $C_1$ and $C_2$ channels, and $V_{C1C1}$ is the variance of the $C_1$ channel. Note that the samples are the pixel values of a plurality of pixels at predetermined locations corresponding to the location of the pixel of interest.

In addition, the covariance $V_{C1C2}$ and the variance $V_{C1C1}$ can be obtained using the following equations (9) and (10):

$$V_{C_1 C_2} = \frac{\sum_{i=1}^{N} [w_i \cdot (C_{1_i} - M_{C_1})(C_{2_i} - M_{C_2})]}{\sum_{i=1}^{N} w_i} \qquad (9)$$

$$V_{C_1 C_2} = \frac{\sum_{i=1}^{N} [w_i \cdot (C_{1_i} - M_{C_1})^2]}{\sum_{i=1}^{N} w_i} \qquad (10)$$

In equations (9) and (10), $w_i$ denotes a predetermined weighting coefficient.

Accordingly, by solving equation (8), noise can be eliminated. However, as shown in FIG. 13, the R MS-SyncNR unit 207 includes the resolution transform units 701 and 702. Therefore, the correction unit 711 corrects the pixel values for images separated for each of frequency ranges using the above-described correlation between two channels.

In addition, among images in a plurality of layers generated by the multiple resolution conversion, direct-current components are concentrated in the minimum-resolution layer. Accordingly, the expectation values of local pixels in the layers other than the minimum-resolution layer are zero. As a result, when the multiple resolution process is used, equations (8) to (10) are replaced by the following equations (11) to (13):

$$C_{2c}' = \frac{V_{C_1 C_2}}{V_{C_1 C_1}} C_{1c} \qquad (11)$$

$$V_{C_1 C_2} = \frac{\sum_{i=1}^{N} [w_i \cdot C_{1_i} \cdot C_{2_i}]}{\sum_{i=1}^{N} w_i} \qquad (12)$$

$$V_{C_1 C_1} = \frac{\sum_{i=1}^{N} [w_i \cdot C_{1_i}^2]}{\sum_{i=1}^{N} w_i} \qquad (13)$$

Accordingly, in practice, the variance computing unit 803 shown in FIG. 14 computes the variance using equation (13). The covariance computing unit 806 computes the covariance using equation (12). Additionally, the multiplier processing unit 807 modifies (corrects) the pixel values using equation (11).

Furthermore, to reduce the high processing load of the multiplication process performed by a computer when the covariance and the variance are computed using equations (12) and (13), an approximate function may be used. Thus, the number of the multiplication processing operations may be reduced. For example, the following approximate functions may be used:

$$V_{C_1 C_2} = \frac{\sum_{i=1}^{N} [2w_i \cdot sgn(C_{1_i}, C_{2_i}) \cdot \min(|C_{1_i}|, |C_{2_i}|)]}{\sum_{i=1}^{N} w_i} \qquad (14)$$

$$sgn(a, b) = \begin{cases} 1 & ((a > 0) \wedge (b > 0)) \vee ((a < 0) \wedge (b < 0)) \\ 0 & (a = 0) \vee (b = 0) \\ -1 & ((a > 0) \wedge (b < 0)) \vee ((a > 0) \wedge (b < 0)) \end{cases}$$

$$V_{C_1 C_1} = \frac{\sum_{i=1}^{N} [2w_i \cdot |C_{1_i}|]}{\sum_{i=1}^{N} w_i} \qquad (15)$$

In addition, the multiple resolution inverse transform unit 717 receives the R channel images without noise in the layers and the R channel image in the minimum-resolution layer and combines all the R channel images into an image having the same resolution as that of the original image. Subsequently, the multiple resolution inverse transform unit 717 outputs the combined image.

As noted above, according to the present exemplary embodiment, a color filter arrangement used for a single-plate color imaging device is defined in which filters of four or more color are included, the filters of some of the colors are regularly arranged, and filters of the other colors are randomly arranged. Then, an image processing unit includes a color filter array having such an arrangement.

According to the present exemplary embodiment, the color filter array having such an arrangement uses the number of colors more than that used in the Bayer arrangement, and therefore, can improve the performance of the color reproduction and the dynamic range.

In addition, since the color filter array includes regularly arranged color filters, the color filter array can provide the resolution that is the same as that of the Bayer arrangement. Additionally, by using a random filter arrangement and the R MS-SyncNR unit 207, the R' MS-SyncNR unit 208, the B MS-SyncNR unit 209, and the B' MS-SyncNR unit 210 shown in FIG. 9, this color filter array can efficiently reduce the occurrence of a false color.

That is, according to the present exemplary embodiment, since the C1 color occupies a half of the total number of pixels in a mosaic image obtained through the color filter array, the C1 color has a resolution higher than that of the other color. Accordingly, the C1 color is allocated to the positions of all the pixels first. Subsequently, high-frequency components of the other colors are estimated (interpolated) using the allocated C1 color as a reference. In this way, an image with high resolution for all the colors can be obtained after the interpolation is performed.

In addition, according to the present exemplary embodiment, in the image obtained by image-processing the mosaic image obtained through the color filter array, a false color that remarkably occurs in a specific spatial frequency range is prevented. On the contrary, a few false colors are distributed in a variety of spatial frequency ranges. Consequently, the false colors are not readily perceived by the human eye. In addition, by using the R MS-SyncNR unit 207, the R' MS-SyncNR unit 208, the B MS-SyncNR unit 209, and the B' MS-SyncNR unit 210, these false colors can be efficiently eliminated.

In the process using the R MS-SyncNR unit 207, the R' MS-SyncNR unit 208, the B MS-SyncNR unit 209, and the B' MS-SyncNR unit 210, a reference channel (e.g., G) signal is determined and estimation is performed so that the correlation of the other channel signal with respect to the reference signal is the highest on the basis of the same idea as the pixel value estimation method using a correlation between channels. Thus, components having no correlation between channels are reduced and chrominance non-uniformity and a color registration error caused by noise components mixed in the chrominance components can be eliminated. According to the present exemplary embodiment, the obtained image has the same characteristic as an image with chrominance non-uniformity. A low correlation between channels results in an image having false colors distributed in a variety of spatial frequency ranges. Therefore, by increasing the correlation between channels using the R MS-SyncNR unit 207, the R' MS-SyncNR unit 208, the B MS-SyncNR unit 209, and the B' MS-SyncNR unit 210, the occurrence of the false color can be eliminated.

According to the present exemplary embodiment, the arrangement of the color filter array can be considered to be the same as the Bayer arrangement when a dumping readout process or a summing readout process is performed.

Second Exemplary Embodiment

According to a second exemplary embodiment, a color filter arrangement is obtained by replacing the C1 color filters arranged in a checkered pattern in the color filter arrangement according to the first exemplary embodiment with regularly arranged filters of two colors C1a and C1b.

As described in Japanese Unexamined Patent Application Publication No. 2005-160044, a new color C1c is generated on the basis of the colors C1a and C1b. Thereafter, using the regular arrangement of the C1a and C1b color filters, the color C1c can be interpolated at the locations of all of the pixels at which the C1a or C1b color filters are present.

The filter arrangement in which the C1c color filters are arranged in place of the C1a and C1b color filters is the same as the filter arrangement described in the first exemplary embodiment.

That is, according to the second exemplary embodiment, the color filter array provides the same advantage as that of the first exemplary embodiment. In addition, since the number of filter colors is incremented by one compared with the first exemplary embodiment, the performance of color reproduction and the dynamic range can be further improved.

FIG. 15 illustrates an exemplary structure of the color filter array according to the second exemplary embodiment.

As shown in FIG. 15, in the color filter array according to the present exemplary embodiment, the filters of two colors G and G' are arranged in a checkered pattern and the filters of other four colors are arranged in a random pattern.

Figure 16:
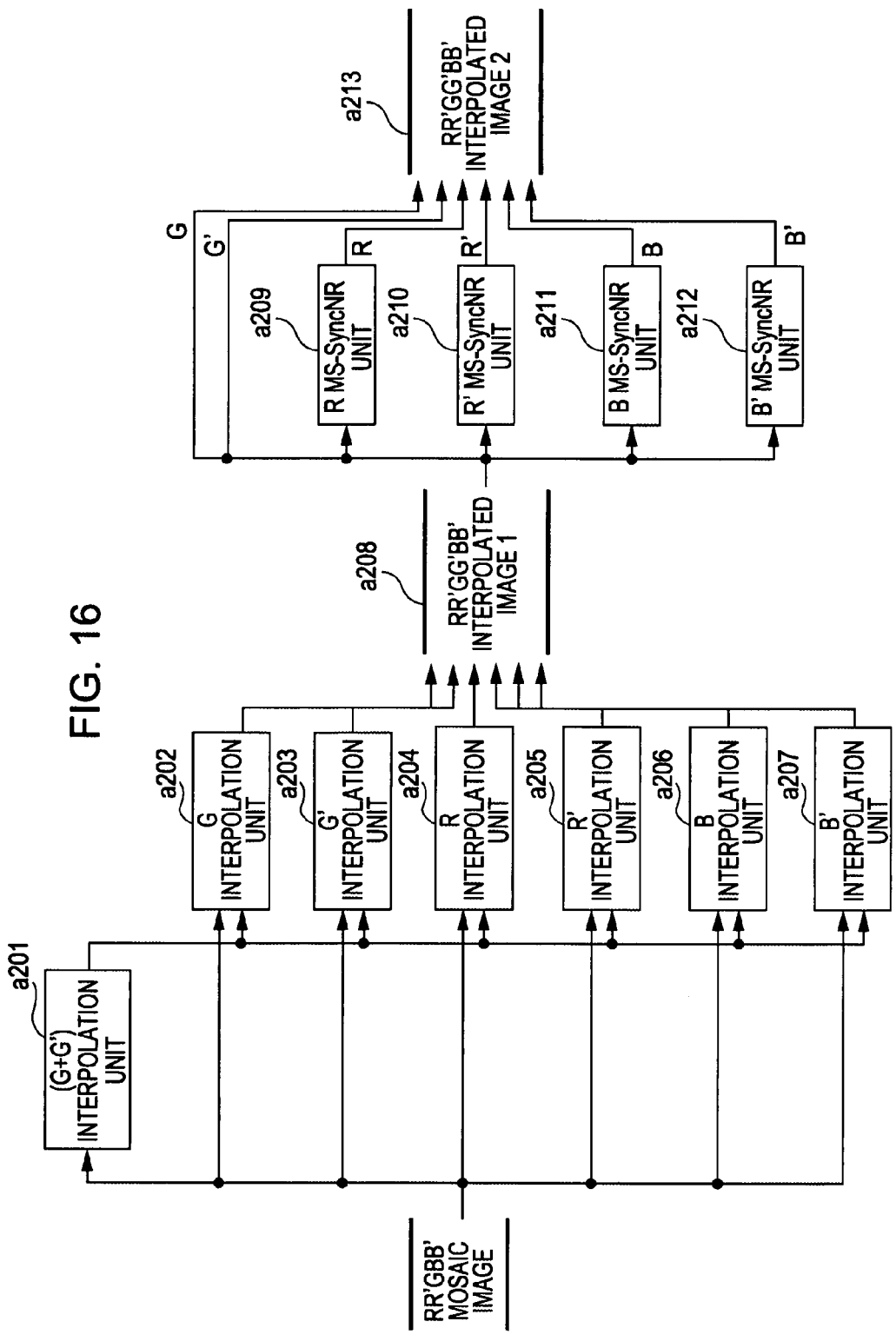
FIG. 16 illustrates a demosaic process performed when the color filter array shown in FIG. 15 is used.

FIG. 16 illustrates a demosaic process performed when the color filter array shown in FIG. 15 is used.

When compared with the image processing unit shown in FIG. 9, as shown in FIG. 16, the image processing unit according to the present exemplary embodiment includes a (G+G') interpolation unit a201 in place of the G interpolation unit 201. Additionally, processes similar to those performed by the R interpolation unit 202, the R' interpolation unit 203, the B interpolation unit 204, and the B' interpolation unit 205 are added to the processes for the G and G' colors (i.e., a G interpolation unit a202 and a G' interpolation unit a203). Thus, a six-plane image (i.e., a first RR'GG'BB' interpolation image a208) is generated instead of a five-plane image.

Since noise caused by a random arrangement does not occur in the G color image and the G' color image, the subsequent noise removing process is skipped. Thus, like the process shown in FIG. 9, the MS-SyncNR process is performed on each of the R, R', B, and B' color images.

To realize the (G+G1) interpolation unit a201, the interpolation algorithm described in Japanese Unexamined Patent Application Publication No. 2005-160044 can be applied. Japanese Unexamined Patent Application Publication No. 2005-160044 describes an interpolation process in which, from an arrangement in which filters of two colors C1 and C2 are arranged in a checkered pattern, a color C3 (=C1+C2) is interpolated for all of a plurality of pixels.

In addition, the block structure shown in FIG. 8 and the flow chart shown in FIG. 9 described in the first exemplary embodiment can be applied to the present exemplary embodiment.

FIG. 17 illustrates a modification of the color filter array according to the present exemplary embodiment. In this color filter array, filters of two colors G and G' are arranged in a checkered pattern, filters of a color R are arranged on every other pixel in the horizontal direction and the vertical direction, and filters of the other two colors are randomly arranged.

According to the present exemplary embodiment, by replacing, for example, the color filters C1 with the color filters C1a and C1b, the performance of color reproduction and the dynamic range can be further improved.

In addition, it is desirable that the correlation of spectral sensitivity between the colors C1a and C1b is higher than that between the other colors. That is, as described in Japanese Unexamined Patent Application Publication No. 2005-160044, when a new color C1c is generated on the basis of the C1a and C1b colors using the regular arrangement of the C1a and C1b color filters, it is desirable that the correlation of spectral sensitivity between the C1a and C1b color filters is high.

In addition, in a process in which a color image having all pixels of a full-color is generated from a mosaic image obtained by an imaging device including the color filter array according to the present exemplary embodiment, a new color C1c is computed using the colors C1a and C1b.

If the color filter C1a is located at the position of the pixel of interest, the image processing unit estimates (interpolates) the pixel value of the C1b color at the position of the pixel of interest using the C1a and C1b colors that are present in the local region including the position of the pixel of interest.

Moreover, if the color filter C1b is located at the position of the pixel of interest, the image processing unit interpolates the pixel value of the C1a color at the position of the pixel of interest using the C1a and C1b colors that are present in the local region including the position of the pixel of interest.

Furthermore, the image processing unit computes the pixel values of the color C1c at the locations of pixels arranged in a checkered pattern from the pixel values of the colors C1a and C1b at those locations. The image processing unit interpolates the pixel values of the color C1c at pixel locations at which the color C1c is not present using the pixel values of the color C1c present around the pixel locations. In addition, the image processing unit interpolates a color CX other than the color C1c using the pixel values of the colors C1c and CX that are present in the local region including the position of the pixel of interest.

Still Furthermore, like the first exemplary embodiment, as shown in FIG. 16, the image processing unit includes an R MS-SyncNR unit a209, an R' MS-SyncNR unit a210, a B MS-SyncNR unit a211, and a B' MS-SyncNR unit a212.

As noted above, according to the present exemplary embodiment, the new color C1c may be generated on the basis of the regularly arranged color filters C1a and C1b. Thereafter, the color C1c can be interpolated for all the pixels on which the color C1a or C1b is present.

The present exemplary embodiment can provide the advantages that are the same as those of the first exemplary embodiment.

While the present invention has been described with reference to the foregoing embodiments, the present invention is not limited thereto.

That is, it should be understood by those skilled in the art that various modifications, combinations, sub-combinations and alterations may occur depending on design requirements and other factors insofar as they are within the scope of the appended claims or the equivalents thereof.

What is claimed is:

1. A color filter array comprising:
    a plurality of filters, each having one of a plurality of types of spectral sensitivity and being disposed at the location of a corresponding one of a plurality of pixels;
    wherein the type of the filters is defined by five colors and wherein the filters having a first color C1 are arranged in a checkered pattern, the filters having a second color C2 or a third color C3 are randomly arranged at pixel locations at which the filters having the first color C1 are not present on every other line in a horizontal direction and a vertical direction, and the filters having a fourth color C4 and a fifth color C5 are randomly arranged at pixel locations at which neither the filters having the first color C1 nor the second color C2 nor the third color C3 are present.

2. The color filter array according to claim 1, wherein the occurrence frequency of the filters of the same type in a region having a predetermined size and including the position of a pixel of interest is within a desired error range.

3. The color filter array according to claim 1, wherein the correlation of spectral sensitivity between the second color C2 and the third color C3 and the correlation of spectral sensitivity between the fourth color C4 and the fifth color C5 are higher than the correlation of spectral sensitivity between the other colors.

4. A color filter array comprising:
    a plurality of filters, each having one of a plurality of types of spectral sensitivity and being disposed at the location of a corresponding one of a plurality of pixels;
    wherein the type of the filters is defined by six colors and wherein the filters of a first color C1a are arranged at the locations of the pixels on every other line in a horizontal direction and a vertical direction, the filters of a second color C1b are arranged at the pixel locations at which the filters of the first color C1a are not present on every other line in a horizontal direction and a vertical direction, the filters of a third color C2 and a fourth color C3 are randomly arranged at the pixel locations at which neither the filters of the first color C1a nor the second color C1b are present on every other line in a horizontal direction and a vertical direction, and the filters of a fifth color C4 and a sixth color C5 are randomly arranged at the pixel locations at which neither the filters of the first color C1a nor the second color C1b nor the third color C2 nor the fourth color C3 are present, and the filters of a fourth color C3 and a fifth color C4 are randomly arranged at pixel locations at which neither the filters having the first color C1a nor the second color C1b nor the third color C3 are present.

5. The color filter array according to claim 4, wherein the correlation of spectral sensitivity between the third color C2 and the fourth color C3 and the correlation of spectral sensitivity between the fifth color C4 and the sixth color C5 are higher than the correlation of spectral sensitivity between the other colors.

6. The color filter array according to any one of claims 4 and 5, wherein the correlation of spectral sensitivity between the first color C1a and the second color C1b is higher than the correlation of spectral sensitivity between the other colors.

7. The color filter array according to claim 4, wherein the occurrence frequency of the filters of the same color in a region having a predetermined size and including the position of a pixel of interest is within a desired error range.

8. An imaging device comprising:
    a color filter array including a plurality of filters, each having one of a plurality of types of spectral sensitivity and being disposed at the location of a corresponding one of a plurality of pixels;
    wherein
    the type of the filters is defined by five colors and wherein the filters having a first color C1 are arranged in a checkered pattern, the filters having a second color C2 or a third color C3 are randomly arranged at pixel locations at which the filters having the first color C1 are not present on every other line in a horizontal direction and a vertical direction, and the filters having a fourth color C4 and a fifth color C5 are randomly arranged at pixel locations at which neither the filters having the first color C1 nor the second color C2 nor the third color C3 are present.

9. An imaging device comprising:
a color filter array including a plurality of filters, each having one of a plurality of types of spectral sensitivity and being disposed at the location of a corresponding one of a plurality of pixels;
wherein the type of the filters is defined by six colors and wherein the filters of a first color C1$a$ are arranged at the locations of the pixels on every other line in a horizontal direction and a vertical direction, the filters of a second color C1$b$ are arranged at the pixel locations at which the filters of the first color C1$a$ are not present on every other line in a horizontal direction and a vertical direction, the filters of a third color C2 and a fourth color C3 are randomly arranged at the pixel locations at which neither the filters of the first color C1$a$ nor the second color C1$b$ are present on every other line in a horizontal direction and a vertical direction, and the filters of a fifth color C4 and a sixth color C5 are randomly arranged at the pixel locations at which neither the filters of the first color C1$a$ nor the second color C1$b$ nor the third color C2 nor the fourth color C3 are present, and the filters of a fourth color C3 and a fifth color C4 are randomly arranged at pixel locations at which neither the filters having the first color C1$a$ nor the second color C1$b$ nor the third color C3 are present.

10. An image processing unit comprising:
receiving means for receiving image data from an imaging device including a color filter array, the color filter array including a plurality of filters, each having one of at least five types of spectral sensitivity and being disposed at the location of a corresponding one of a plurality of pixels, the filters of a first color C1$a$ selected from among the at least five types of color being arranged at the locations of the pixels on every other: line in a horizontal direction and a vertical direction, the filters of a second color C1$b$ selected from among the at least five types of color being arranged at the pixel locations at which the filters of the first color C1$a$ are not present on every other line in a horizontal direction and a vertical direction, and the filters of some or all of the other colors being randomly arranged at the pixel locations at which neither the filters of the first color C1$a$ nor the second color C1$b$ are present;
first interpolating means for interpolating a pixel value of a third color C1$c$ at a pixel location of a pixel of interest using the pixel values of the first color C1$a$ and the second color C1$b$ that are present in a local region including the pixel of interest in the image data received by the receiving means; and second interpolating means for interpolating a pixel value of each color CX of the plurality of filter colors including the colors C1$a$ and C1$b$ by using pixels of the third color C1$c$ and the color CX that are present in the local region including the pixel of interest.

11. The image processing unit according to claim 10, further comprising:
multiple resolution transforming means for transforming a plurality of images of the colors generated by the second interpolating means into a plurality of layered images of a multiple-resolution image;
correcting means for correcting one of the plurality of images in each layered image except for the layered image of the minimum resolution on the basis of the correlation among the plurality of images; and
multiple resolution inverse transforming means for inverse transforming each layered image corrected by the correcting means.

12. An image processing unit comprising:
a receiving device configured to receive image data from an imaging device including a color filter array, the color filter array including a plurality of filters, each having one of a plurality of types of spectral sensitivity and being disposed at the location of a corresponding one of a plurality of pixels,
the type of the filters being defined by five colors and wherein the filters having a first color C1 are arranged in a checkered pattern, the filters having a second color C2 or a third color C3 are randomly arranged at pixel locations at which the filters having the first color C1 are not present on every other line in a horizontal direction and a vertical direction, and the filters having a fourth color C4 and a fifth color C5 are randomly arranged at pixel locations at which neither the filters having the first color C1 nor the second color C2 nor the third color C3 are present:
a first interpolating device configured to interpolate a pixel value of a first color C1 at a pixel location of the image data received by the receiving means at which the predetermined color is not present using pixels of the first color C1 present in the vicinity of the pixel location so as to generate a first image; and a second interpolating device configured to interpolate a pixel value of a second color CX different from the first color C1 using pixels of the first color C1 and the second color CX that are present in a local region including a pixel of interest so as to generate a second image.

13. An image processing unit comprising: a receiving device configured to receive image data from an imaging device including a color filter array, the color filter array including a plurality of filters, each having one of a plurality of types of spectral sensitivity and being disposed at the location of a corresponding one of a plurality of pixels,
the types of the filters being defined by six colors and wherein the filters of the first color C1$a$ are arranged at the locations of the pixels on every other line in a horizontal direction and a vertical direction, the filters of the second color C1$b$ are arranged at the pixel locations at which the filters of the first color C1$a$ are not present on every other line in a horizontal direction and a vertical direction, the filters of a third color C2 and a fourth color C3 are randomly arranged at the pixel locations at which neither the filters of the first color C1$a$ nor the second color C1$b$ are present on every other line in a horizontal direction and a vertical direction, and the filters of a fifth color C4 and a sixth color C5 are randomly arranged at the pixel locations at which neither the filters of the first color C1$a$ nor the second color C1$b$ nor the third color C2 nor the fourth color C3 are present, and the filters of a fourth color C3 and a fifth color C4 are randomly arranged at pixel locations at which neither the filters of the first color C1$a$ nor the second color C1$b$ nor the third color C3 are present,
a first interpolating device configured to interpolate a pixel value of a third color C1$c$ at a pixel location of a pixel of interest using the pixel values of the first color C1$a$ and the second color C1$b$ that are present in a local region including the pixel of interest in the image data received by the receiving device; and a second interpolating device configured to interpolate a pixel value of each color CX of the plurality of filter colors including the color C1$a$ and the color C1$b$ by using pixels of the third color C1$c$ and the color CX that are present in the local region including the pixel of interest.

* * * * *

UNITED STATES PATENT AND TRADEMARK OFFICE
CERTIFICATE OF CORRECTION

PATENT NO. : 7,710,476 B2 Page 1 of 1
APPLICATION NO. : 11/714261
DATED : May 4, 2010
INVENTOR(S) : Yoshikuni Nomura et al.

It is certified that error appears in the above-identified patent and that said Letters Patent is hereby corrected as shown below:

Column 22, line 40, "C1bnor" should read --C1b nor--.

Column 23, line 43, "other: line" should read --other line--.

Column 24, line 27, "present:" should read --present;--.

Signed and Sealed this

Twenty-fourth Day of August, 2010

David J. Kappos
*Director of the United States Patent and Trademark Office*